US008679731B2

(12) United States Patent
Fukuhara et al.

(10) Patent No.: US 8,679,731 B2
(45) Date of Patent: *Mar. 25, 2014

(54) SEMICONDUCTOR DEVICE MANUFACTURING METHOD

(75) Inventors: Kazuya Fukuhara, Tokyo (JP); Takaki Hashimoto, Yokohama (JP); Kazuyuki Masukawa, Yokohama (JP); Yasunobu Kai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/606,834

(22) Filed: Sep. 7, 2012

(65) Prior Publication Data

US 2012/0328992 A1 Dec. 27, 2012

Related U.S. Application Data

(63) Continuation of application No. 12/390,157, filed on Feb. 20, 2009, now Pat. No. 8,293,456.

(30) Foreign Application Priority Data

Mar. 3, 2008 (JP) .................................. 2008-052450
Dec. 25, 2008 (JP) .................................. 2008-330621

(51) Int. Cl.
*G03F 7/20* (2006.01)
(52) U.S. Cl.
USPC ................................ 430/319; 430/396; 430/5
(58) Field of Classification Search
USPC ............................................ 430/319, 396, 5
See application file for complete search history.

(56) References Cited

U.S. PATENT DOCUMENTS

| 6,197,456 B1 * | 3/2001 | Aleshin et al. ................... 430/5 |
| 6,355,382 B1 | 3/2002 | Yasuzato et al. |
| 7,214,453 B2 | 5/2007 | Yamazoe et al. |

(Continued)

FOREIGN PATENT DOCUMENTS

| JP | 5-36586 | 2/1993 |
| JP | 5-243115 | 9/1993 |

(Continued)

OTHER PUBLICATIONS

Notice of Reasons for Rejection mailed by the Japanese Patent Office on Apr. 5, 2011, in Japanese patent application No. 2010-225050.

(Continued)

*Primary Examiner* — Daborah Chacko Davis
(74) *Attorney, Agent, or Firm* — Finnegan, Henderson, Farabow, Garrett & Dunner, LLP

(57) ABSTRACT

A semiconductor device manufacturing method includes applying illumination light to a photomask, and projecting diffracted light components from the photomask via a projection optical system to form a photoresist pattern on a substrate. The photomask includes a plurality of opening patterns which are arranged on each of a plurality of parallel lines at regular second intervals in a second direction and which have regular first intervals in a first direction perpendicular to the second direction. The plurality of opening patterns arranged on the adjacent ones of the plurality of parallel lines are displaced from each other half the second interval in the second direction. Moreover, the dimensions of the plurality of opening patterns and the complex amplitude transmittance of nontransparent region in the photomask are set so that three of the diffracted light components passing through the pupil of the projection optical system have equal amplitude.

8 Claims, 24 Drawing Sheets

(56) References Cited

U.S. PATENT DOCUMENTS

| | | | |
|---|---|---|---|
| 8,293,456 B2 * | 10/2012 | Fukuhara et al. | 430/311 |
| 2005/0136340 A1 | 6/2005 | Baselmans et al. | |
| 2008/0063988 A1 * | 3/2008 | Fukuhara et al. | 430/327 |

FOREIGN PATENT DOCUMENTS

| | | |
|---|---|---|
| JP | 7-202143 | 8/1995 |
| JP | 11-72904 | 3/1999 |
| JP | 2000-206667 | 7/2000 |
| JP | 2002-31883 | 1/2002 |
| JP | 2002-90979 | 3/2002 |
| JP | 3441140 | 6/2003 |
| JP | 2004-272228 | 9/2004 |
| JP | 2005-55878 | 3/2005 |
| JP | 2007-109969 | 4/2007 |
| JP | 2007-123333 | 5/2007 |
| JP | 2007-201298 | 8/2007 |
| JP | 2008-66586 | 3/2008 |
| JP | 2009-31320 | 2/2009 |

OTHER PUBLICATIONS

Notice of Reasons for Rejection mailed by the Japanese Patent Office on Aug. 10, 2010, in Japanese patent application No. 2008-330621.

* cited by examiner

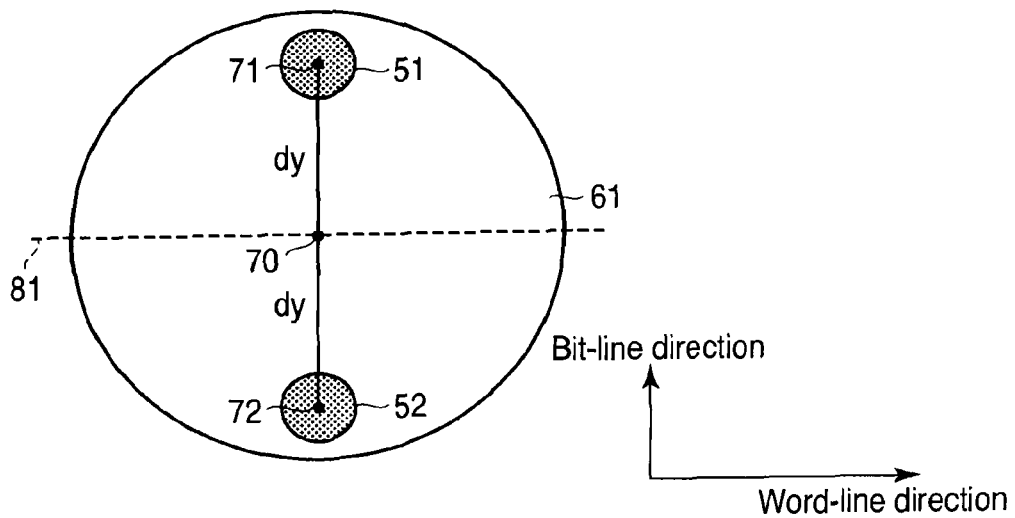
F I G. 2
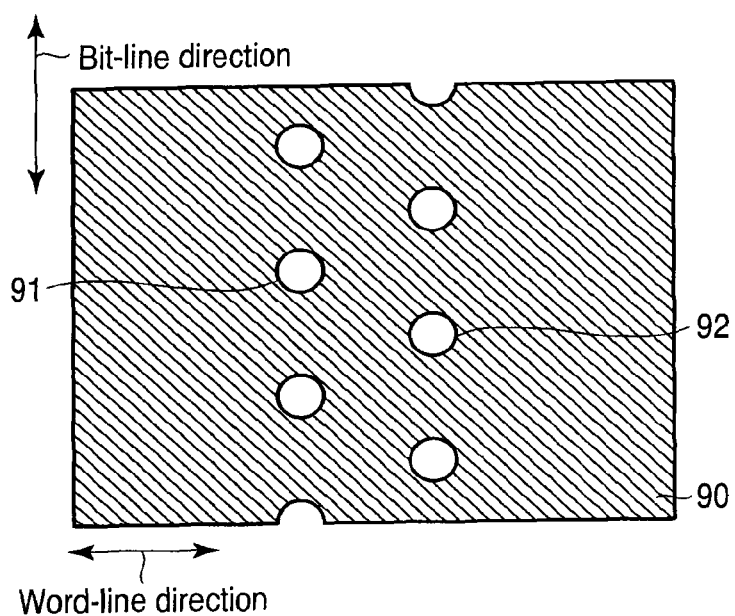
F I G. 3

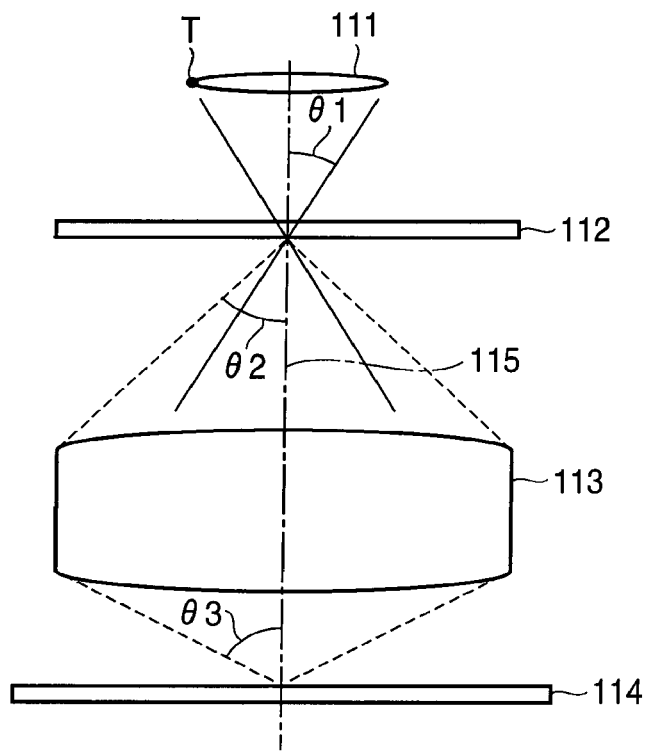
F I G. 4
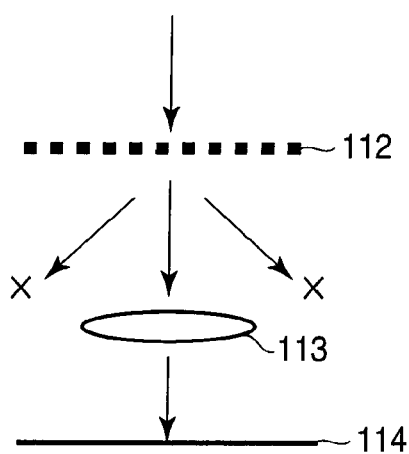
F I G. 5

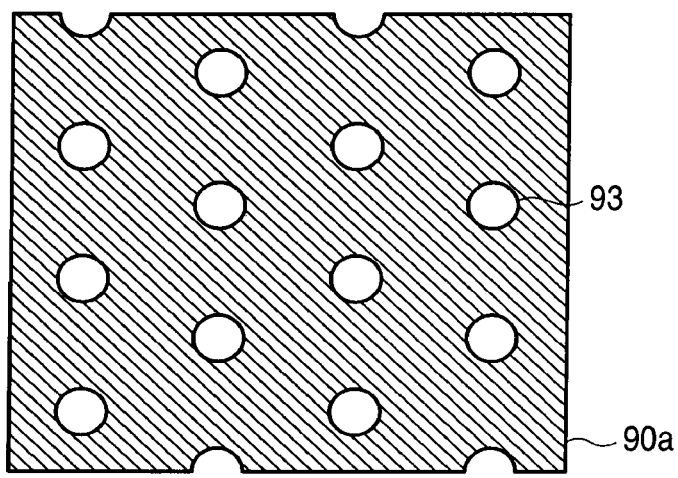
F I G. 13
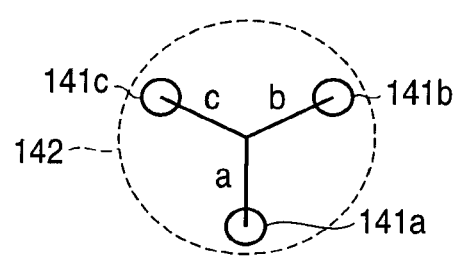
F I G. 14
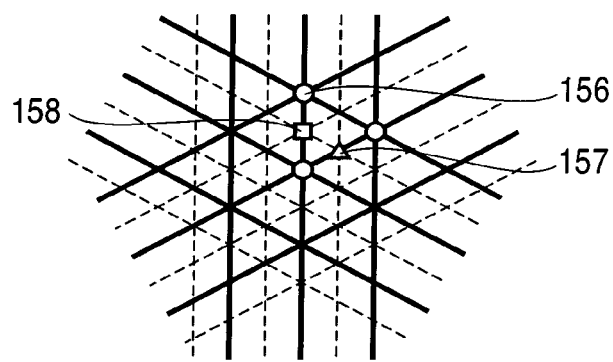
F I G. 15

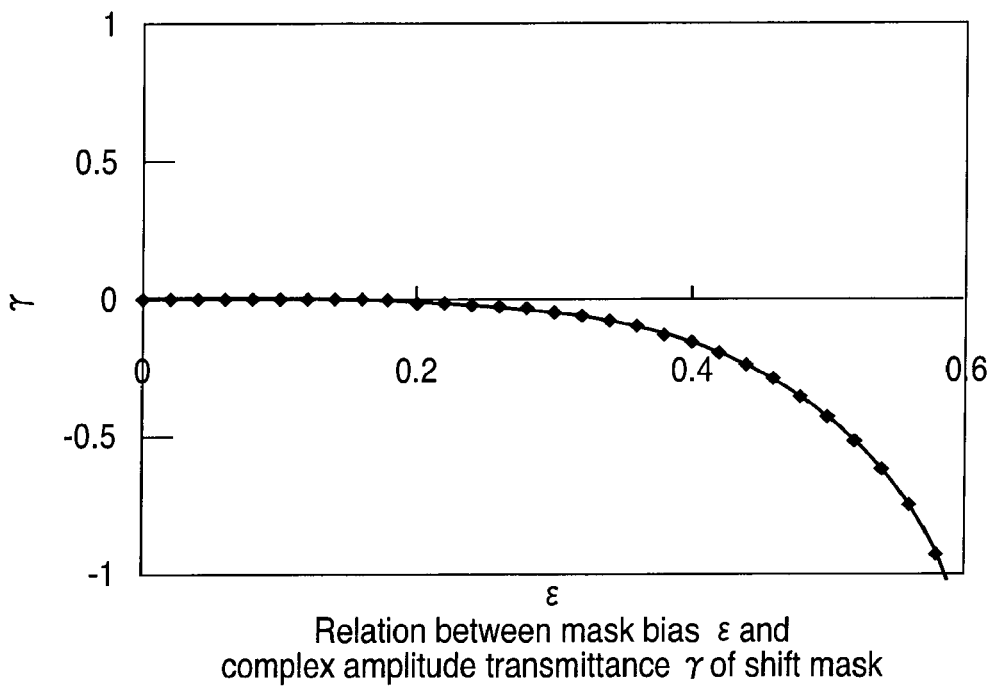
Relation between mask bias ε and
complex amplitude transmittance γ of shift mask
F I G. 16
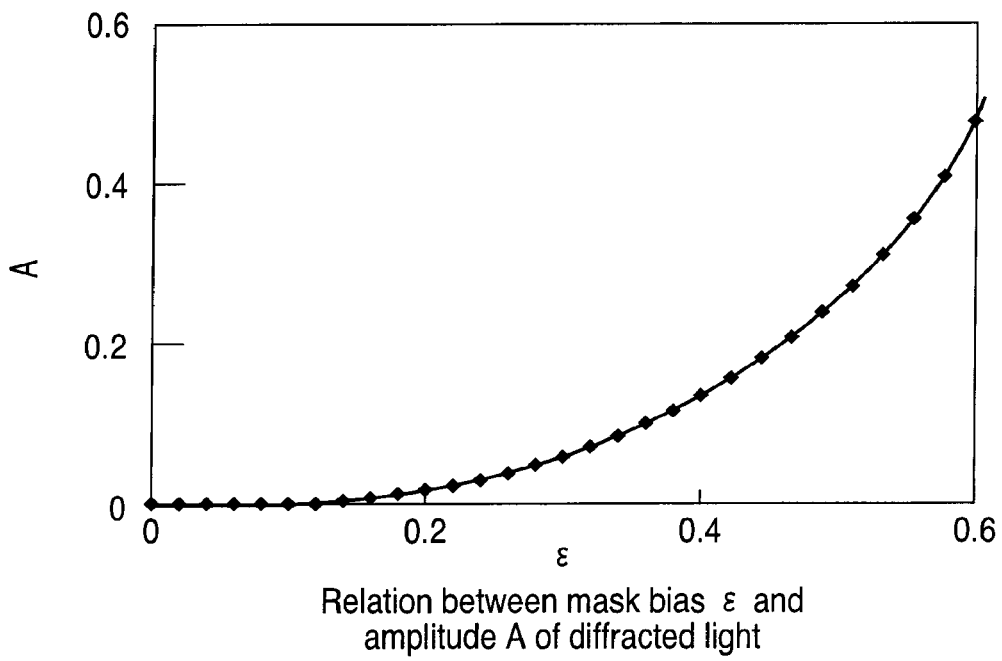
Relation between mask bias ε and
amplitude A of diffracted light
F I G. 17

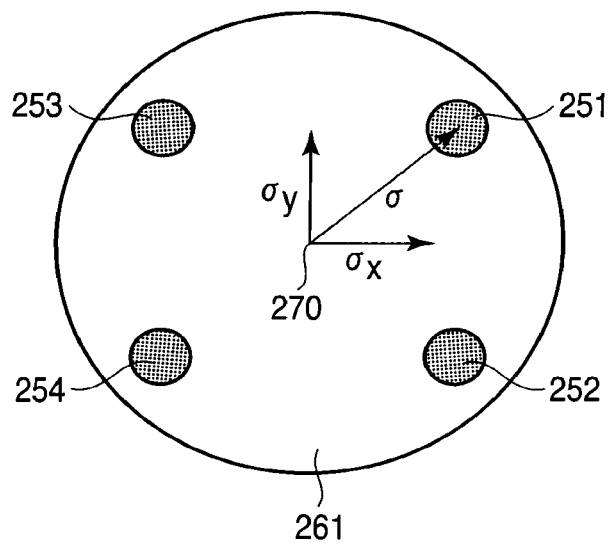
F I G. 19
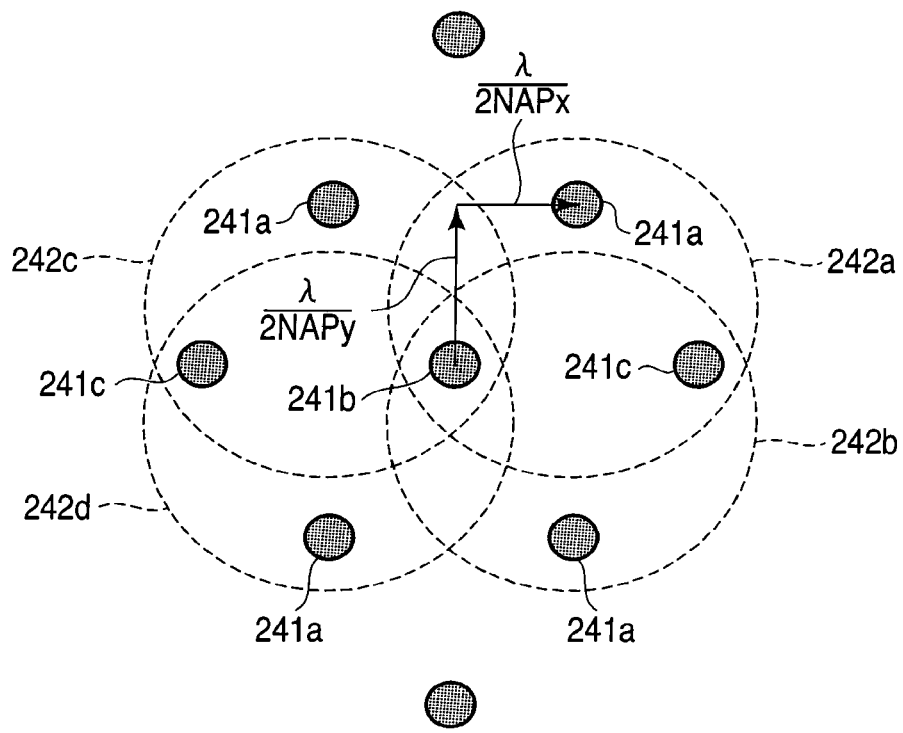
F I G. 20

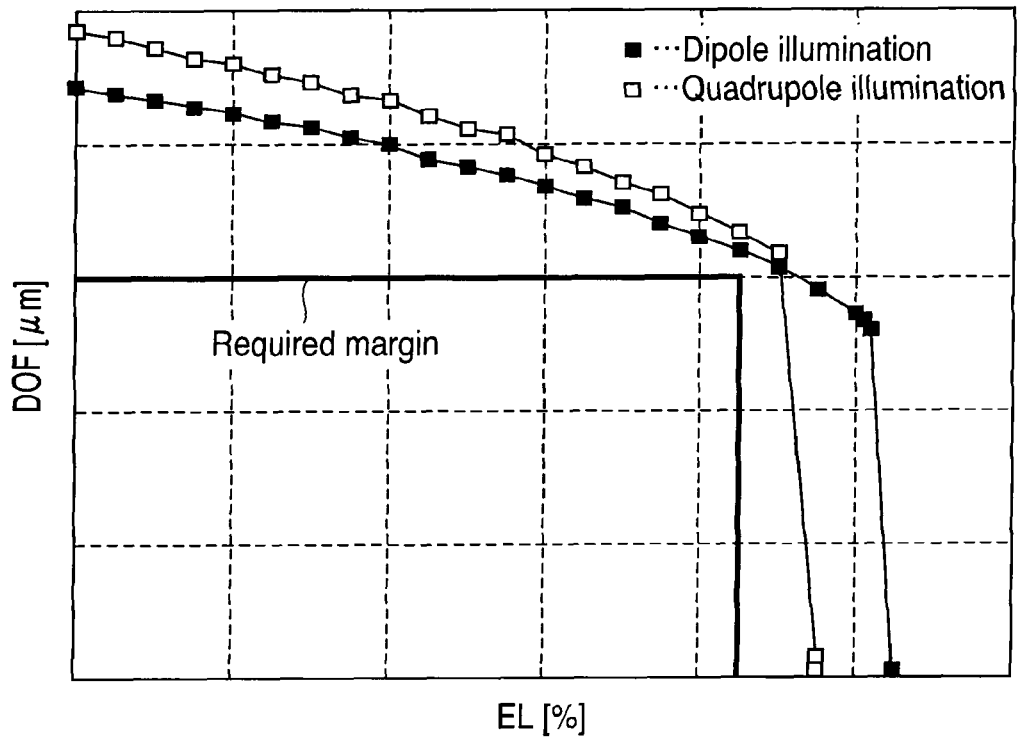
F I G. 21
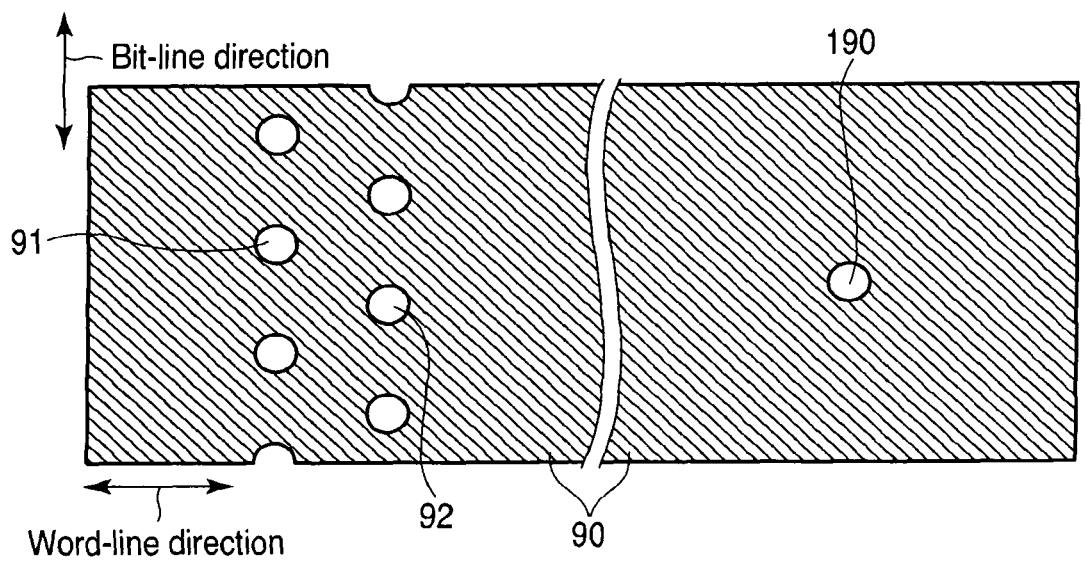
F I G. 22

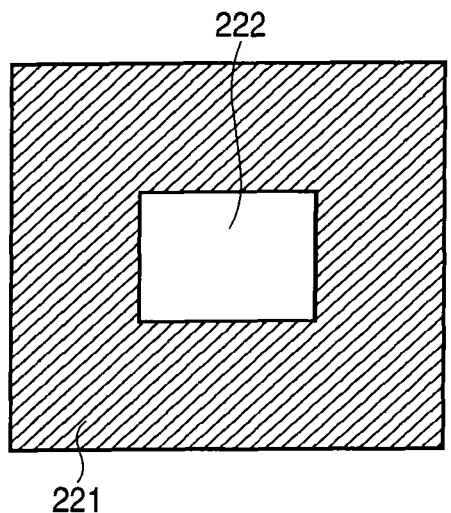
F I G. 23A
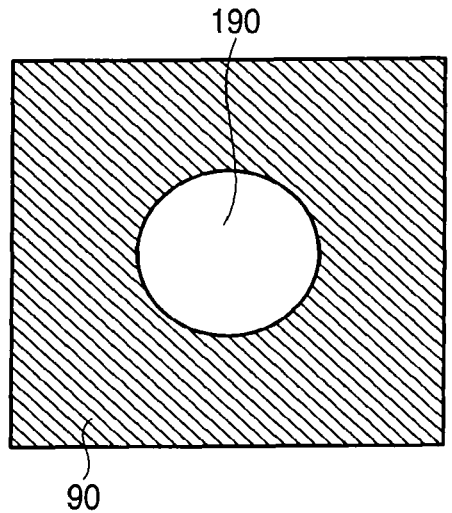
F I G. 23B
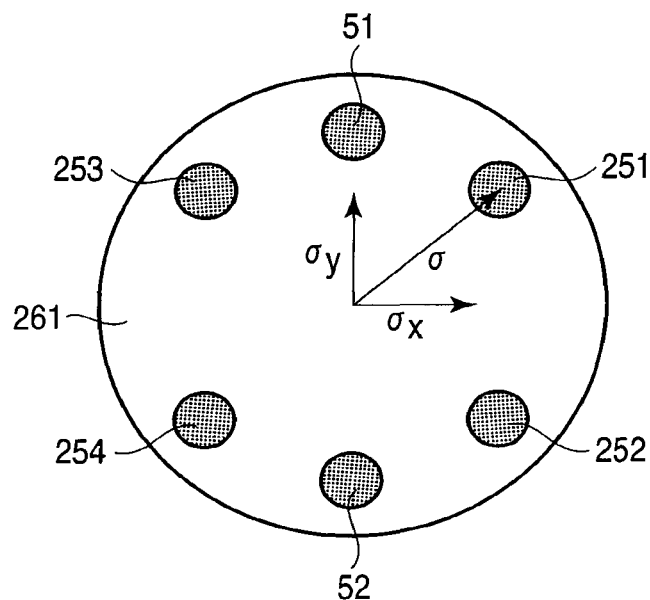
F I G. 24

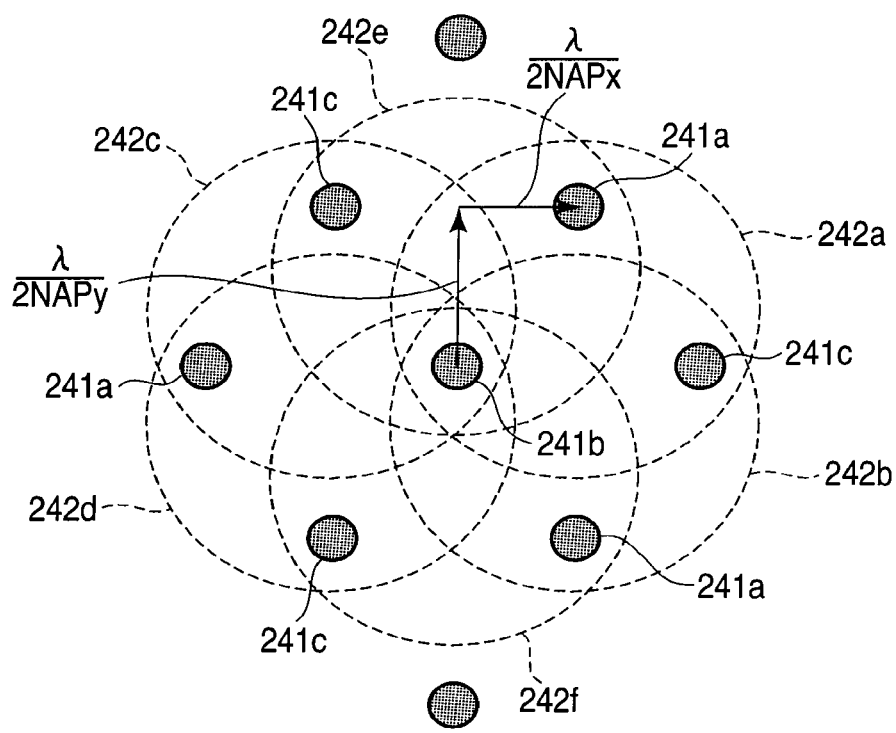
F I G. 25

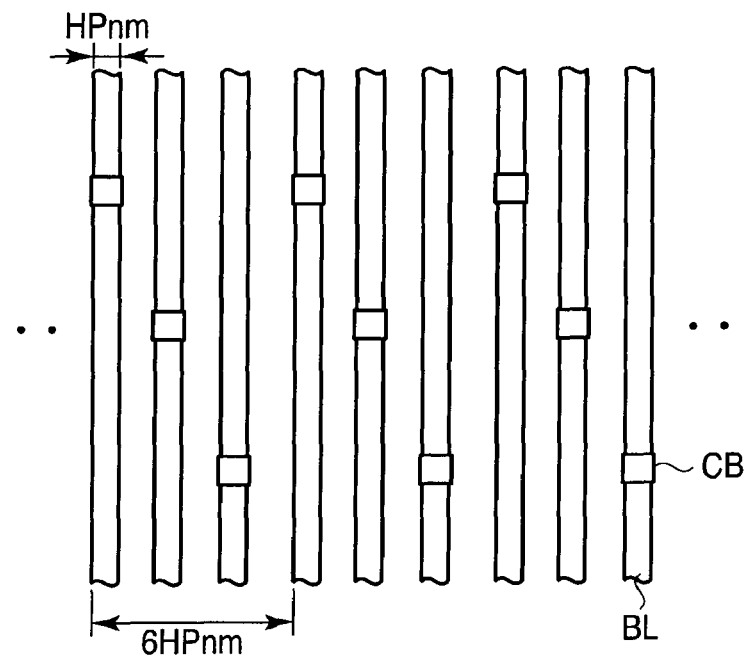
F I G. 27
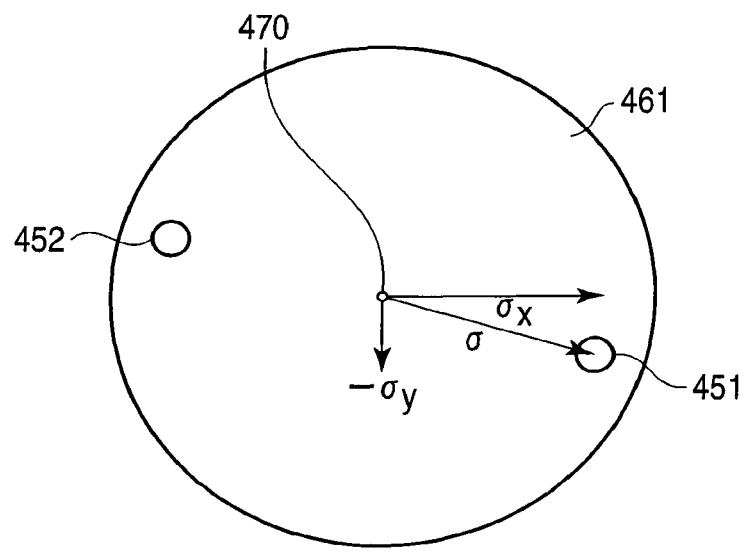
F I G. 28

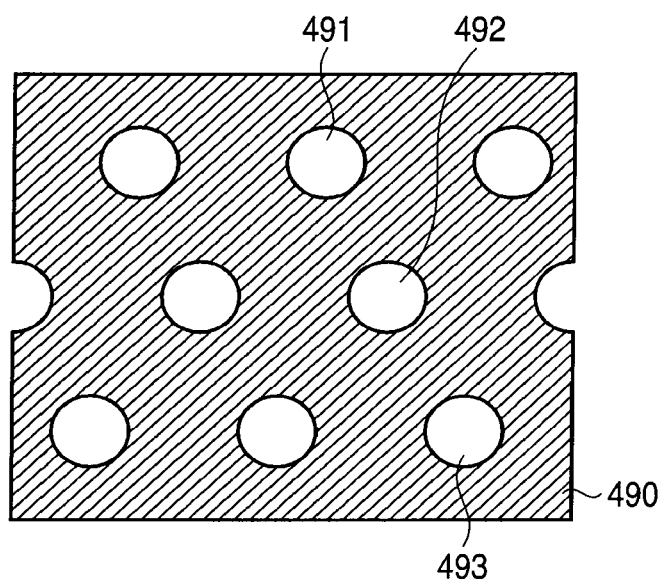
F I G. 29

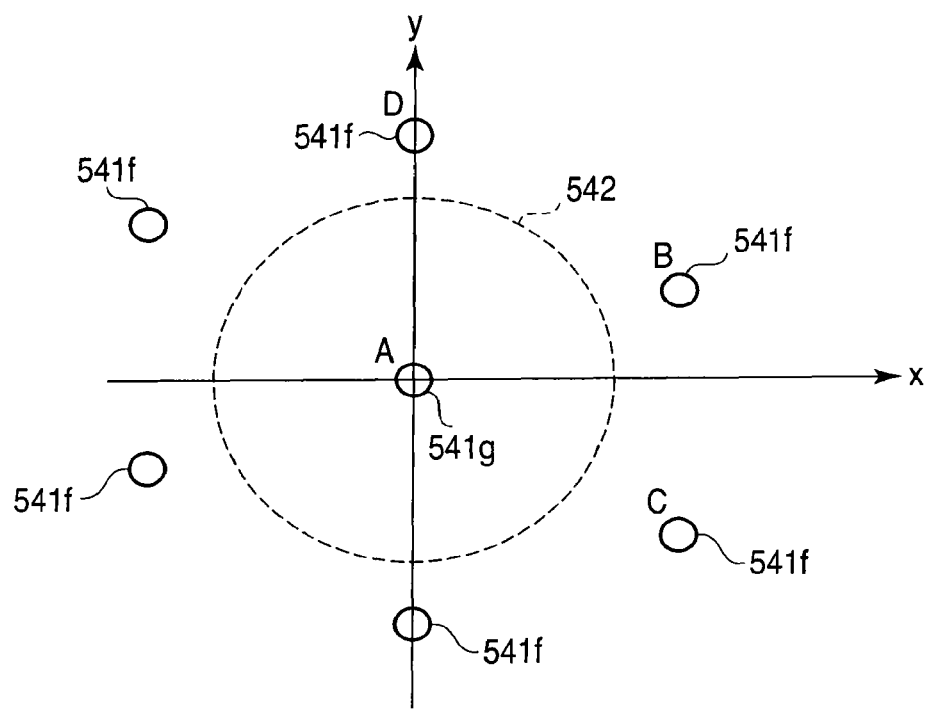
F I G. 31
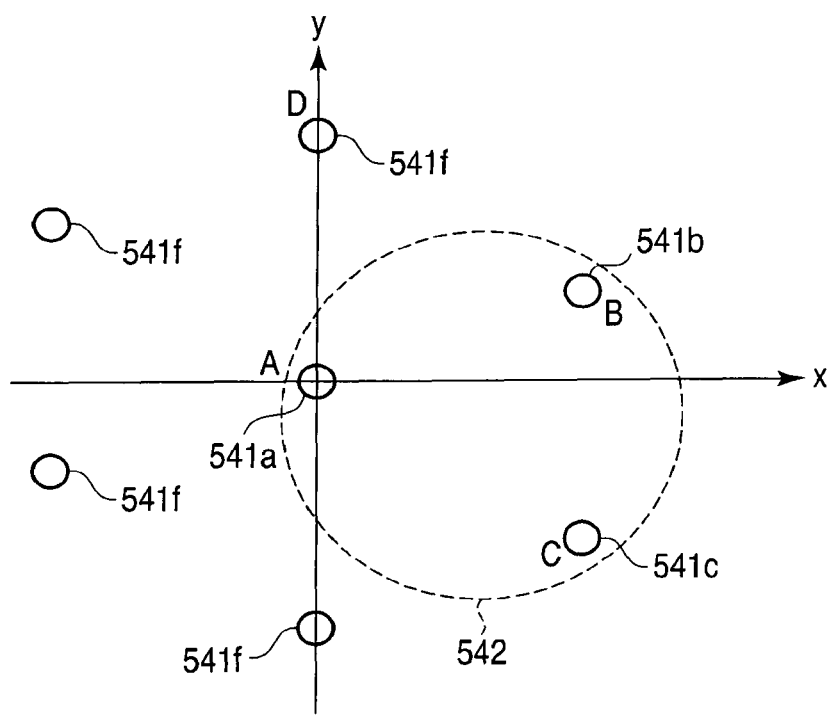
F I G. 32

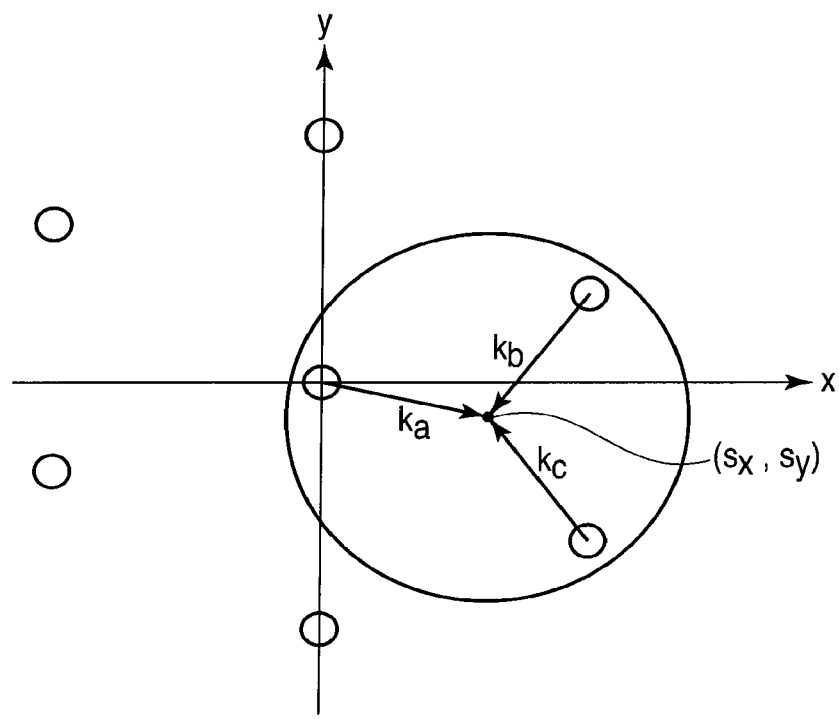
F I G. 35
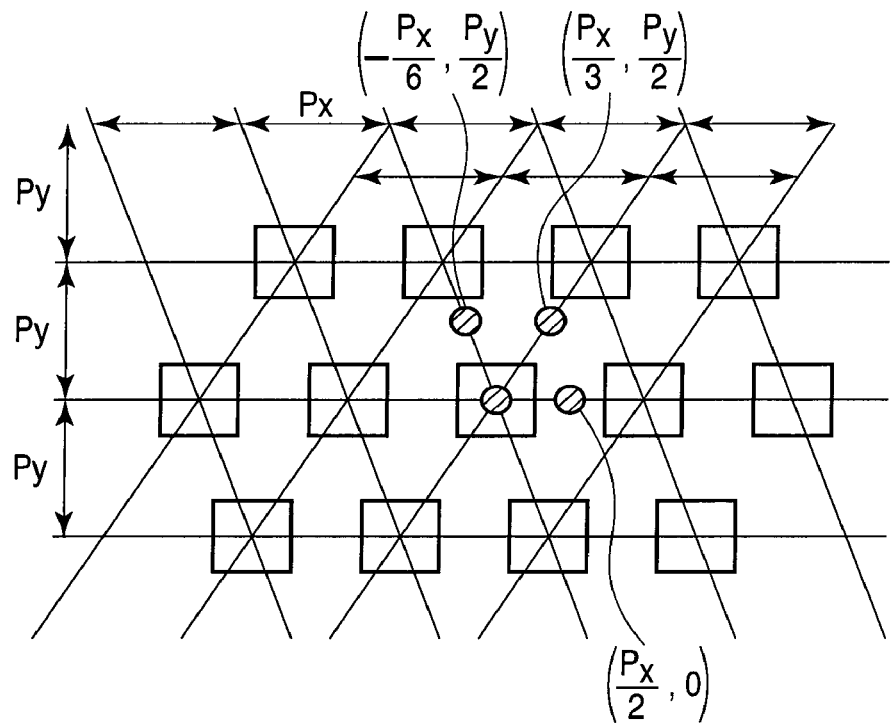
F I G. 36

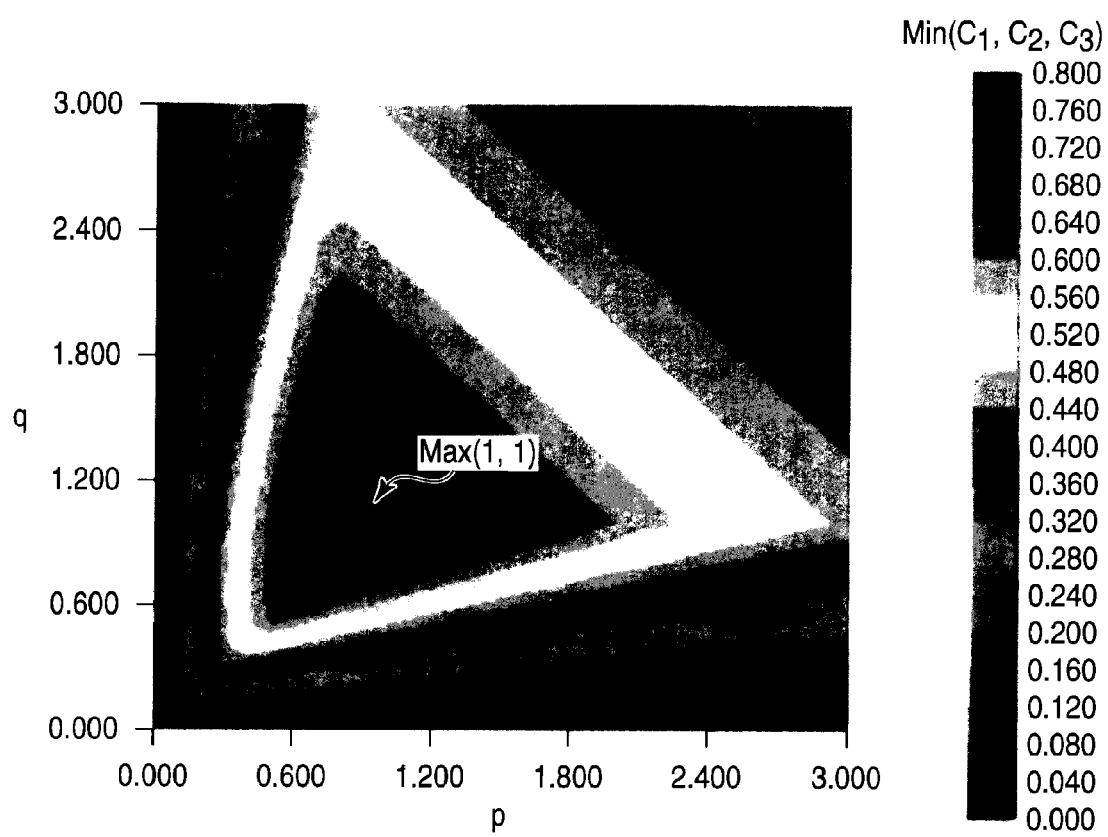
F I G. 37

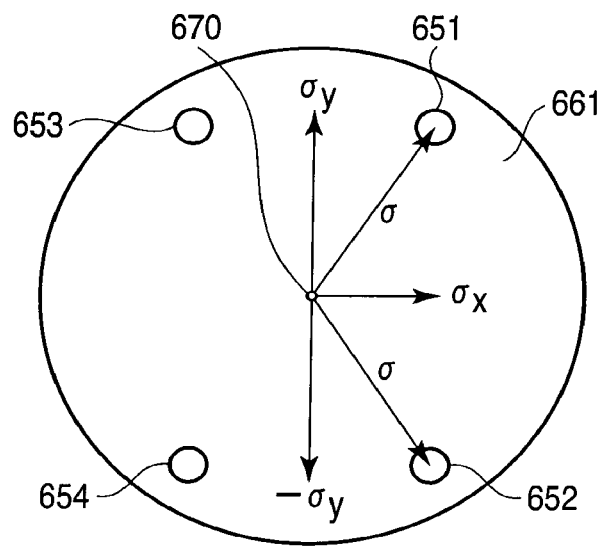
F I G. 40
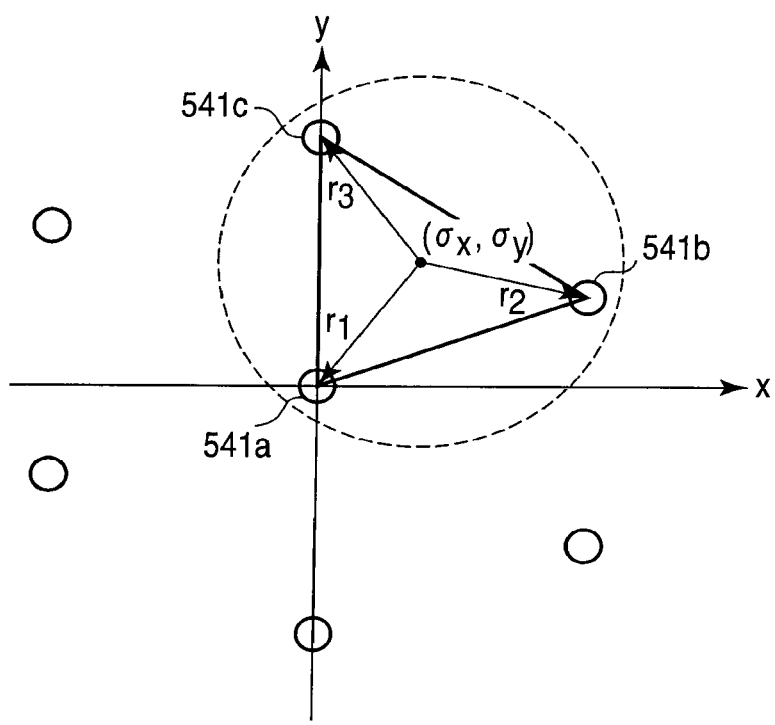
F I G. 41

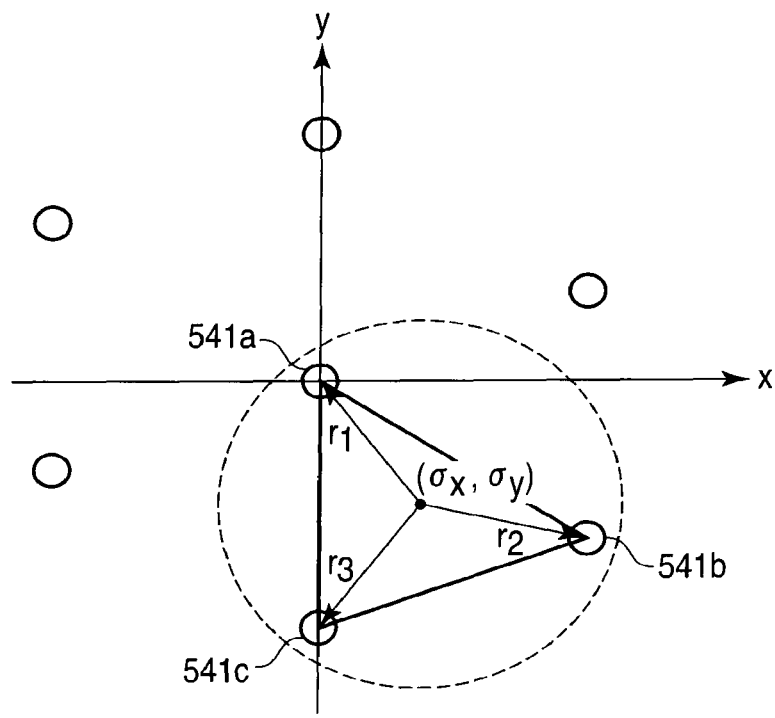
F I G. 42
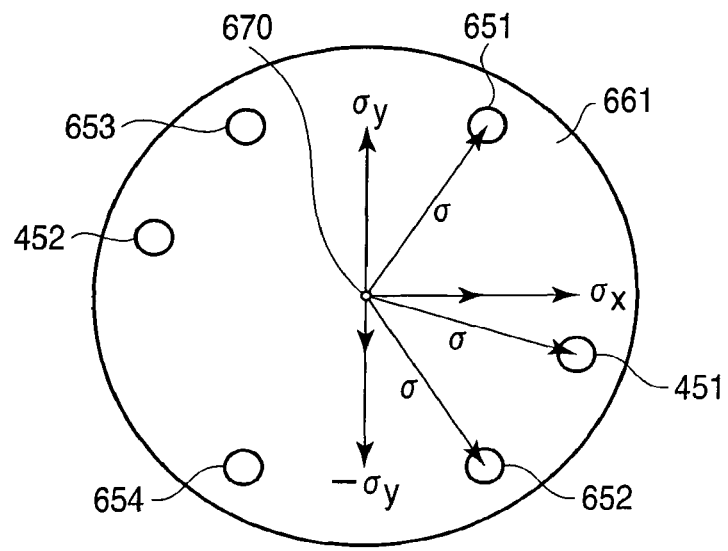
F I G. 43

SEMICONDUCTOR DEVICE MANUFACTURING METHOD

CROSS-REFERENCE TO RELATED APPLICATIONS

This application is a continuation of U.S. patent application Ser. No. 12/390,157, filed Feb. 20, 2009, now U.S. Pat. No. 8,293,456, which claims the benefit of priority from prior Japanese Patent Applications No. 2008-052450, filed Mar. 3, 2008; and No. 2008-330621, filed Dec. 25, 2008, the entire contents of all of which are incorporated herein by reference.

BACKGROUND OF THE INVENTION

1. Field of the Invention

The present invention relates to a semiconductor device manufacturing method. More particularly, the present invention is used to form, for example, a bit-line contact connected to a diffusion layer of a selected transistor in a NAND cell unit.

2. Description of the Related Art

In a semiconductor device, forming a pattern with high density is important for higher integration. To this end, it has been proposed, in relation to, for example, a NAND flash memory, to arrange a plurality of contact holes for bit-line contact in a staggered form (see, for example, Japanese Patent No. 3441140).

However, opening patterns are "dense" in an oblique direction in a mask pattern for the formation of the contact holes. The reason is that openings (transparent regions) for the formation of the contact holes are arranged in a staggered form. Thus, an exposure allowance and the depth of focus are reduced, and it is difficult to hold down dimensional errors in an exposure process. That is, the NAND flash memory requires the formation of a micropattern which is a dense hole pattern having regularly arranged opening patterns and in which the holes are not orthogonally arranged in the form of a lattice. However, there has heretofore been difficulty in highly accurately forming the micropattern.

BRIEF SUMMARY OF THE INVENTION

According to a first aspect of the present invention, there is provided a semiconductor device manufacturing method comprising: applying illumination light from an illumination light source to a photomask containing a mask pattern composed of a transparent region and a nontransparent region, and projecting diffracted light components from the photomask on a substrate via a projection optical system to form a photoresist pattern corresponding to the mask pattern on the substrate, wherein the mask pattern includes a plurality of opening patterns which are the transparent regions, the centers of the opening patterns being arranged on each of a plurality of parallel lines at regular second intervals in a second direction, the plurality of parallel lines having regular first intervals in a first direction and extending in the second direction perpendicular to the first direction, the centers of the plurality of opening patterns arranged on the adjacent ones of the plurality of parallel lines are displaced from each other half the second interval in the second direction; the illumination shape of the illumination light source is set so that three of the diffracted light components from the photomask pass through the pupil of the projection optical system; and the dimensions of the plurality of opening patterns and the complex amplitude transmittance of the nontransparent region in the photomask are set so that the three diffracted light components have equal amplitude.

According to a second aspect of the present invention, there is provided a semiconductor device manufacturing method comprising: applying illumination light from an illumination light source to a photomask containing a mask pattern composed of a transparent region and a nontransparent region, and projecting diffracted light components from the photomask on a substrate via a projection optical system to form a photoresist pattern corresponding to the mask pattern on the substrate, wherein the mask pattern includes a plurality of opening patterns which are the transparent regions, the centers of the opening patterns being arranged on each of a plurality of parallel lines at regular second intervals in a second direction, the plurality of parallel lines having regular first intervals in a first direction and extending in the second direction perpendicular to the first direction, the centers of the plurality of opening patterns arranged on the adjacent ones of the plurality of parallel lines are displaced from each other one third of the second interval in the second direction; and the illumination shape of the illumination light source is set so that three of the diffracted light components from the photomask pass through the pupil of the projection optical system.

BRIEF DESCRIPTION OF THE SEVERAL VIEWS OF THE DRAWING

FIG. 2 is a diagram showing an example of the configuration of dipole illumination according to the first embodiment;

FIG. 3 is a plan view showing one example of contact hole patterns formed in a photoresist according to the first embodiment;

FIG. 4 is a diagram shown to explain a σ (sigma) coordinate system of the illumination;

FIG. 5 is a diagram shown to explain the case where vertical illumination light is used and no image is formed;

FIG. 13 is a diagram showing as an example the case where the mask pattern in FIG. 7 is used to form contact hole patterns in the photoresist, to explain the reason that the dipole illumination is desirable;

FIG. 14 is a diagram shown to explain the relation between the position and intensity of the diffracted light in the projection lens pupil, with regard to the reason that the dipole illumination is desirable;

FIG. 15 is a diagram shown to explain the optimization of the amplitude of interference waves;

FIG. 16 is a graph showing the relation between a mask bias and the complex amplitude transmittance of a attenuated phase-shift mask;

FIG. 17 is a graph showing the relation between the mask bias and the amplitude of the diffracted light;

FIG. 19 is a diagram showing an example of the configuration of quadrupole illumination;

FIG. 20 is a diagram showing the distribution of diffracted light components on a surface corresponding to the surface of a projection lens pupil in the case where oblique illumination light is radiated, to explain the reason that the quadrupole illumination is desirable;

FIG. 21 is a graph showing an exposure latitude obtained by the quadrupole illumination in comparison with an exposure latitude obtained by the dipole illumination;

FIG. 22 is a diagram showing as an example the case where contact hole patterns are formed in a photoresist, to explain the reason that the quadrupole illumination is desirable;

FIGS. 23A and 23B are diagrams showing as an example the case where an independent contact hole pattern is formed in the photoresist, to explain the reason that the quadrupole illumination is desirable;

FIG. 24 is a diagram showing an example of the configuration of hexapole illumination;

FIG. 25 is a diagram showing the distribution of diffracted light components on a surface corresponding to the surface of a projection lens pupil in the case where oblique illumination light is radiated, to explain the reason that the hexapole illumination is desirable;

FIG. 27 is a diagram showing a triple zigzag arrangement of contact holes for bit-line contact, in a NAND flash memory as an example;

FIG. 28 is a diagram showing an example of the configuration of modified dipole illumination according to the second embodiment;

FIG. 29 is a plan view showing one example of contact hole patterns formed in a photoresist according to the second embodiment;

FIG. 31 is a diagram showing the distribution of diffracted light components on a surface corresponding to the surface of a projection lens pupil in the case where vertical illumination light is radiated, to explain the reason that the modified dipole illumination is desirable;

FIG. 32 is a diagram showing the distribution of diffracted light components on the surface corresponding to the surface of the projection lens pupil in the case where oblique illumination light is radiated, to explain the reason that the modified dipole illumination is desirable;

FIG. 35 is a diagram showing wavenumber vectors of the diffracted light components with respect to the center of the projection lens pupil, to explain the reason that the modified dipole illumination is desirable;

FIG. 36 is a diagram shown to explain the light intensities of a bright part and dark parts, with regard to the reason that the modified dipole illumination is desirable;

FIG. 37 is a graph shown to explain the relation between the amplitude of the diffracted light and contrast;

FIG. 40 is a diagram showing an example of the configuration of modified quadrupole illumination;

FIG. 41 is a diagram showing the distribution of diffracted light components on a surface corresponding to the surface of a projection lens pupil in the case where oblique illumination light is radiated, to explain the reason that the modified quadrupole illumination is desirable;

FIG. 42 is a diagram showing another distribution of the diffracted light on the surface corresponding to the surface of the projection lens pupil in the case where the oblique illumination light is radiated, to explain the reason that the modified quadrupole illumination is desirable; and FIG. 43 is a diagram showing an example of the configuration of modified hexapole illumination.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of dimensions. The following embodiments are directed to a device and a method for embodying the technical concept of the present invention and the technical concept does not specify the material, shape, structure or configuration of components of the present invention. Various changes and modifications can be made to the technical concept without departing from the scope of the claimed invention.

First Embodiment

Figure 1:
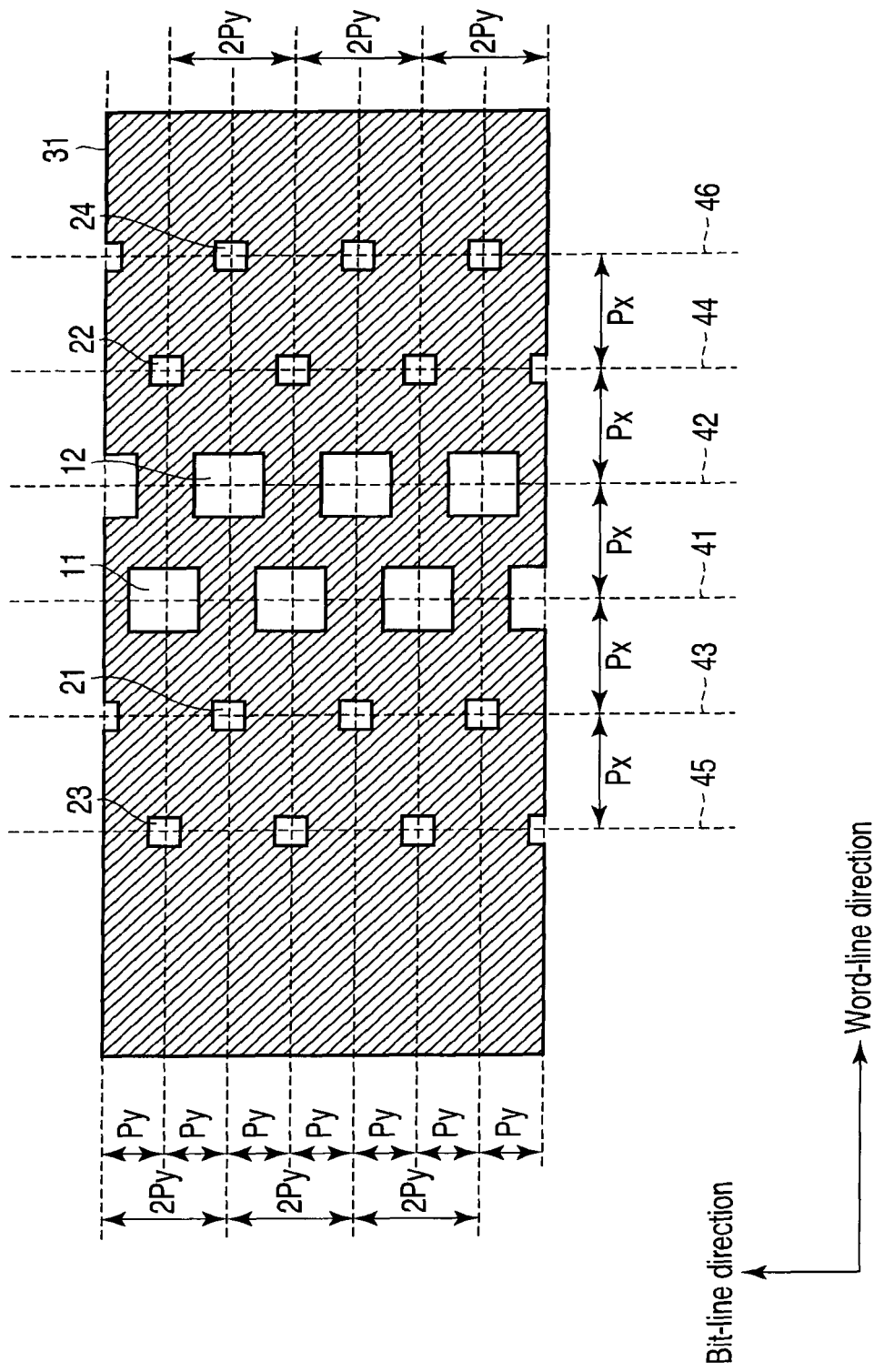
FIG. 1 is a plan view showing one example of a photomask according to a first embodiment of the present invention.

FIG. 1 shows one example of a photomask according to a first embodiment of the present invention. It should be noted that contact holes for bit-line contact in a NAND flash memory (what is called a micropattern which is a dense hole pattern and in which holes are not orthogonally arranged in the form of a lattice; for example, a double zigzag arrangement of holes in a NAND-CB layer) are formed in the case described as an example in the present embodiment.

In FIG. 1, the photomask has main openings (first main openings) 11, main openings (second main openings) 12, assist openings (first assist openings) 21, assist openings (second assist openings) 22, assist openings (third assist openings) 23 and assist openings (fourth assist openings) 24. These openings 11, 12, 21, 22, 23, 24 are enclosed by a light-blocking region (nontransparent region) 31. The light-blocking region 31 is, for example, a light-blocking region in which a chromium film is formed, or, for example, a semi-transparent halftone phase-shift region in which a molybdenum silicide film is formed.

The main openings 11, 12 have the same shape and dimensions, and the assist openings 21, 22, 23, 24 have the same shape and dimensions. The assist openings 21, 22, 23, 24 are smaller than the main openings 11, 12.

The main openings 11, 12 are opening patterns (transferred patterns) corresponding to contact hole patterns for bit-line contact. Patterns corresponding to the main openings 11, 12 are formed in a photoresist after exposure and development processes. The assist openings 21, 22, 23, 24 are auxiliary patterns (non-resolution assist patterns). Patterns corresponding to the assist openings 21, 22, 23, 24 are not formed in the photoresist after the exposure and development processes.

The plurality of main openings 11 are arranged at a pitch 2Py (second interval) on a straight line (first straight line) 41 extending in a bit-line direction (second direction). That is, the center of each of the main openings 11 is located on the straight line 41. The plurality of main openings 12 adjacent to the main openings 11 are arranged at the pitch 2Py on a straight line (second straight line) 42 extending in the bit-line direction. That is, the center of each of the main openings 12 is located on the straight line 42.

The straight line 41 and the straight line 42 are parallel to each other, and the distance (first distance (first interval) in a first direction (word-line direction)) between the straight line 41 and the straight line 42 is Px. Moreover, the main openings 11 and the main openings 12 are displaced Py from each other in the bit-line direction.

The plurality of assist openings 21 adjacent to the main openings 11 are arranged at the pitch 2Py on a straight line (third straight line) 43 extending in the bit-line direction. That is, the center of each of the assist openings 21 is located on the straight line 43. The plurality of assist openings 22 adjacent to the main openings 12 are arranged at the pitch 2Py on a straight line (fourth straight line) 44 extending in the bit-line direction. That is, the center of each of the assist openings 22 is located on the straight line 44. The plurality of assist openings 23 adjacent to the assist openings 21 are arranged at the pitch 2Py on a straight line (fifth straight line) 45 extending in the bit-line direction. That is, the center of each of the assist openings 23 is located on the straight line 45. The plurality of assist openings 24 adjacent to the assist openings 22 are arranged at the pitch 2Py on a straight line (sixth straight line) 46 extending in the bit-line direction. That is, the center of each of the assist openings 24 is located on the straight line 46.

The straight lines 41, 42, 43, 44, 45 and 46 are parallel to each other. The distance (first interval) between the straight line 41 and the straight line 43 is Px. The distance between the straight line 42 and the straight line 44 is also Px. Moreover, the distance between the straight line 43 and the straight line 45 is Px, and the distance between the straight line 44 and the straight line 46 is also Px.

The assist openings 21 are displaced Py with respect to the main openings 11 in the bit-line direction. Likewise, the assist openings 22 are displaced Py with respect to the main openings 12 in the bit-line direction. Thus, the assist openings 21 and the assist openings 22 are displaced Py from each other in the bit-line direction. On the other hand, the assist openings 23 are displaced Py from the assist openings 21 in the bit-line direction. Likewise, the assist openings 24 are displaced Py from the assist openings 22 in the bit-line direction. That is, the assist openings 22, 23 are arranged at the same pitch (2Py) as the main openings 11 in the bit-line direction. The assist openings 21, 24 are also arranged at the same pitch (2Py) as the main openings 12.

It is appreciated from the above explanation that the assist openings 23, the assist openings 21, the main openings 11, the main openings 12, the assist openings 22 and the assist openings 24 are arranged at the same pitch in the oblique direction. That is, the photomask shown in FIG. 1 is increased in the periodicity in the oblique direction by the addition of the assist openings 21, 22, 23, 24 (see, for example, U.S. application Ser. No. 11/896, 871 (U.S. Publication No. 2008-0063988)).

Here, for example, it is assumed that NA=1.3, λ=193 nm, Px=80 nm and Py=90 nm when the pitch Px of the opening patterns in the word-line direction and the pitch Py in the bit-line direction satisfy the relation in Expression (1):

$$\sqrt{P_x^2 + P_y^2} < \frac{\lambda}{NA} \quad (1)$$

where NA is the numerical aperture of a projection lens, and λ is an exposure wavelength.

When a microhole pattern is to be formed under such conditions (the wavelength λ and the numerical aperture NA), the use of conventional general illumination (vertical illumination light) results in insufficient contrast of an image to be formed on a substrate, so that such conditions are vulnerable to errors in exposure or focus. It is therefore impossible to form a necessary hole pattern. There is no problem in the case where the pitches Px, Py of the opening patterns are great when the size of the opening pattern on the photomask is equal to a numerical value obtained by dividing a desired dimension of the hole pattern on the substrate by the magnification of the projection lens. However, the size of the opening pattern matters when the pitches Px, Py are small.

The present embodiment enables the formation of a microhole pattern (a micropattern which is a dense hole pattern and in which holes are not orthogonally arranged in the form of a lattice) suitable for exposure under conditions where the minimum pattern pitch of the opening patterns is λ/NA, in a photolithography technique used for the exposure of the hole patterns.

FIG. 2 shows an example of the configuration of illumination in the present embodiment. In the present embodiment, dipole illumination which is modified illumination is used.

As shown in FIG. 2, the dipole illumination has a luminous region (first luminous region) 51 and a luminous region (second luminous region) 52. These luminous regions 51, 52 are enclosed by a nonluminous region 61.

The luminous region 51 and the luminous region 52 are provided symmetrically to each other with respect to a center 70 of illumination. That is, the luminous region 51 and the luminous region 52 have the same shape and the same dimensions. The center of the luminous region 51 and the center of the luminous region 52 are located symmetrically to each other with respect to the center 70 of illumination. Moreover, the luminous region 51 and the luminous region 52 contain a point 71 (first point) and a point 72 (second point), respectively. The point 71 and the point 72 are symmetrical to each other with respect to the center 70 of illumination. The point 71 and the point 72 are also symmetrical to each other with respect to a straight line 81 passing through the center 70 of illumination and extending in a word-line direction (x-direction, first direction) perpendicular to the bit-line direction (y-direction, second direction). That is, the distance (dy) between the center 70 of illumination and the point 71 is equal to the distance (dy) between the center 70 of illumination and the point 72.

It is ideally desirable that the center of the luminous region 51 be coincident with the point 71 and that the center of the luminous region 52 be coincident with the point 72. In this case, the luminous region 51 and the luminous region 52 are symmetrical to each other with respect to the straight line 81.

In addition, it is desirable that the distance dy between the center 70 of illumination and the point 71 and the distance dy between the center 70 of illumination and the point 72 satisfy the relation in Expression (2) on a σ coordinate system of the illumination:

$$dy = \frac{\lambda}{4NA}\left(\frac{1}{P_y} + \frac{P_y}{P_x^2}\right) \quad (2)$$

where λ is the wavelength of the illumination light, and NA is the numerical aperture of the projection lens through which the illumination light passes. The σ coordinate system will be described later.

Oblique illumination light from the above-mentioned modified illumination is applied to the photoresist via the above-mentioned photomask (see FIG. 1), such that a highly accurate contact hole pattern having controlled dimensional errors can be formed on the photoresist.

FIG. 3 shows one example of contact hole patterns formed in a photoresist after the exposure and development processes.

As shown in FIG. 3, contact hole patterns 91, 92 are formed in a photoresist 90. That is, patterns corresponding to the main openings 11, 12 shown in FIG. 1 are formed as the contact hole patterns 91, 92 in the photoresist 90. No patterns corresponding to the assist openings 21, 22, 23, 24 shown in FIG. 1 are not formed in the photoresist 90.

Here, the above-mentioned a coordinate system is described with reference to FIG. 4.

In FIG. 4, 111 denotes an illumination optical system, 112 denotes a photomask, 113 denotes a projection optical system (projection lens), 114 denotes a substrate (semiconductor wafer), and 115 denotes an optical axis. The exit side numerical aperture of the illumination optical system 111 is sin (θ1), and the entrance side numerical aperture of the illumination optical system 113 is sin (θ2). The value σ is defined as sin(θ1)/sin(θ2).

In the modified illumination such as the dipole illumination, the σ coordinate system is generally used with the extended definition of the σ value. In the σ coordinate system, the optical axis is determined to be an origin, and the entrance side numerical aperture of the projection optical system is normalized at "1". Therefore, an illumination position of a T point in FIG. 4 is indicated in the σ coordinate system as follows:

(σx,σy)=(sin(θ1)/sin(θ2),0)

Described below is the reason that the highly accurate contact hole pattern having controlled dimensional errors can be formed by the above-mentioned photomask (see FIG. 1) and by an exposure method using the modified illumination (see FIG. 2).

Figure 6:
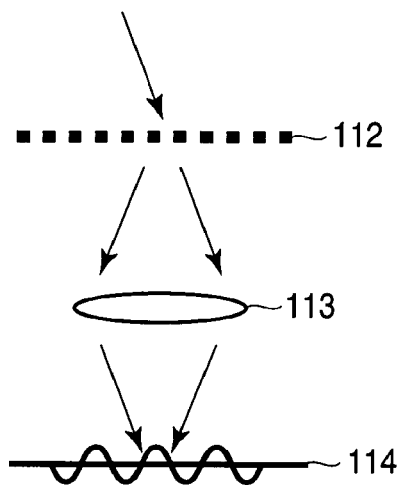
FIG. 6 is a diagram shown to explain the case where oblique illumination light is used and an image is formed.

When the intervals between the patterns sized on the substrate is smaller than λ/NA, the use of vertical illumination light does not allow diffracted light components other than zero-order diffracted light to reach the substrate due to a large angle of diffraction. Thus, for example, as shown in FIG. 5, there is no interference and no image is formed. The use of oblique illumination light enables image formation owing to the interference between zero-order diffracted light and primary diffracted light, for example, as shown in FIG. 6.

When the oblique illumination light is used, a greater focal depth is obtained by a periodic pattern than by an independent pattern. Thus, in the present embodiment, the assist openings 21, 22, 23, 24 shown in FIG. 1 are added to provide periodicity in the whole pattern. That is, the main openings 11 and the main openings 12 shown in FIG. 1 are obliquely arranged, so that the periodicity in the oblique direction is increased by the addition of the assist openings 21, 22, 23, 24.

Next, the reason that the dipole illumination shown in FIG. 2 is desirable is described. It should be noted that the following explanation is based on the assumption that a mask pattern (photomask) shown in FIG. 7 is used instead of the photomask shown in FIG. 1 for brevity.

Figure 7:
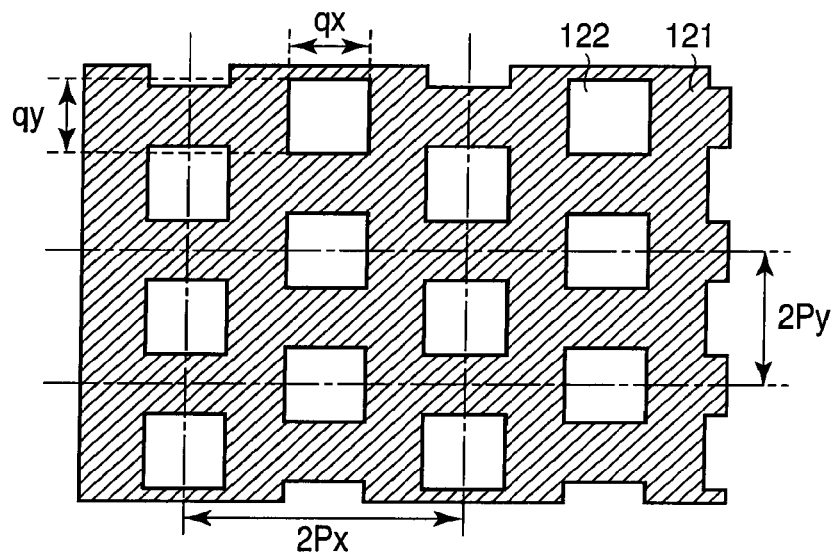
FIG. 7 is a plan view of a mask pattern shown to explain the reason that the dipole illumination is desirable.

The photomask shown in FIG. 1 as a grating can be considered to produce diffracted light in the same direction as the mask pattern shown in FIG. 7. In FIG. 7, 121 denotes a light-blocking region, and 122 denotes an opening.

Figure 8:
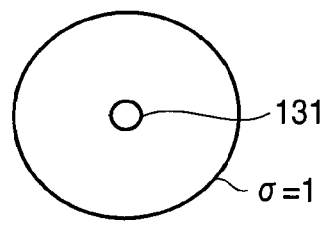
FIG. 8 is a diagram showing an example of the configuration of small a illumination for radiating vertical illumination light to explain the reason that the dipole illumination is desirable.
Figure 9:
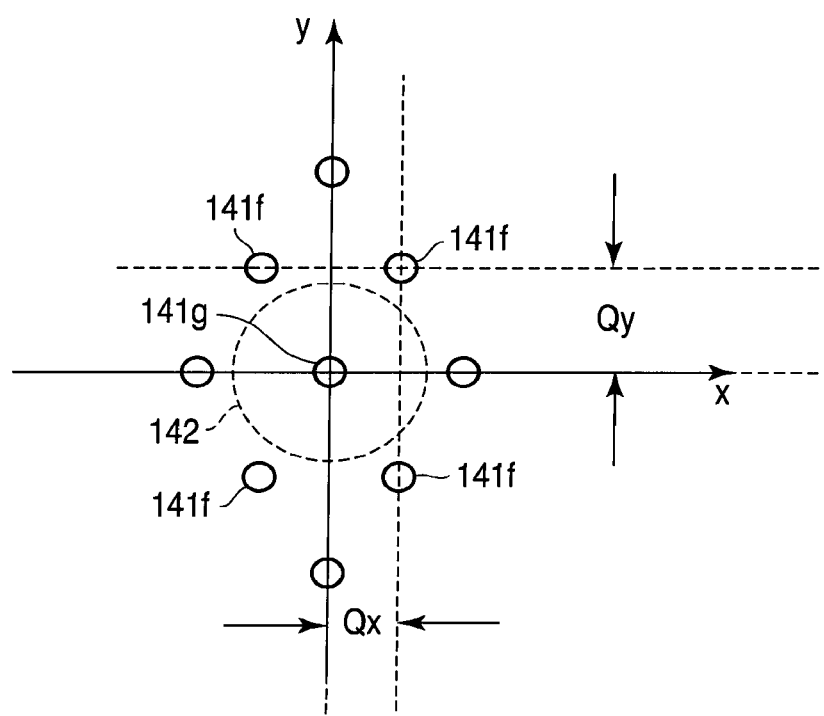
FIG. 9 is a diagram showing the distribution of diffracted light components on a surface corresponding to the surface of a projection lens pupil in the case where the vertical illumination light is radiated, to explain the reason that the dipole illumination is desirable.

Suppose that the vertical illumination light from illumination (small σ illumination) as shown in FIG. 8 is applied to the mask pattern shown in FIG. 7. That is, in the illumination in FIG. 8, a luminous region 131 is provided in the center of illumination. In this case, diffracted light in a surface corresponding to that of the pupil of the projection lens shows a distribution in FIG. 9. A coordinate system in FIG. 9 is the σ coordinate system in which the radius (σ value) of the projection lens pupil is normalized at "1". That is, FIG. 9 shows the distribution of the diffracted light in the surface of the projection lens pupil in the case where the mask pattern shown in FIG. 7 is Fourier-transformed.

In FIG. 9, 141g denotes zero-order diffracted light, and 141f denotes primary diffracted light. The coordinate positions of four primary diffracted light components 141f are:
(+Qx, +Qy)
(+Qx, −Qy)
(−Qx, +Qy)
(−Qx, −Qy), where Qx=λ/(2Py×NA)

Qx=λ/(2Px×NA). In addition, λ is the wavelength of the illumination light, and NA is the numerical aperture of the projection lens (projection optical system). Further, in FIG. 7, the pitch of the openings 122 in the x-direction is Px, and the pitch of the openings 122 in the y-direction is Py. Moreover, 142 in FIG. 9 denotes an effective region (unit circle) of the projection lens pupil, and the diffracted light in the effective region 142 only reaches the substrate. Thus, in the case in FIG. 9, one diffracted light (zero-order diffracted light) 141g alone reaches the substrate, so that there is no interference and no image is formed on the substrate.

Figure 10:
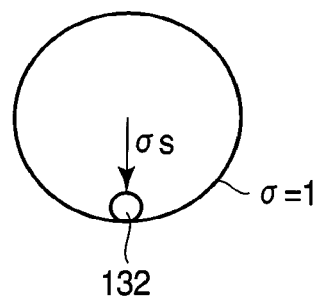
FIG. 10 is a diagram showing an example of the configuration of oblique illumination for radiating oblique illumination light to explain the reason that the dipole illumination is desirable.
Figure 11:
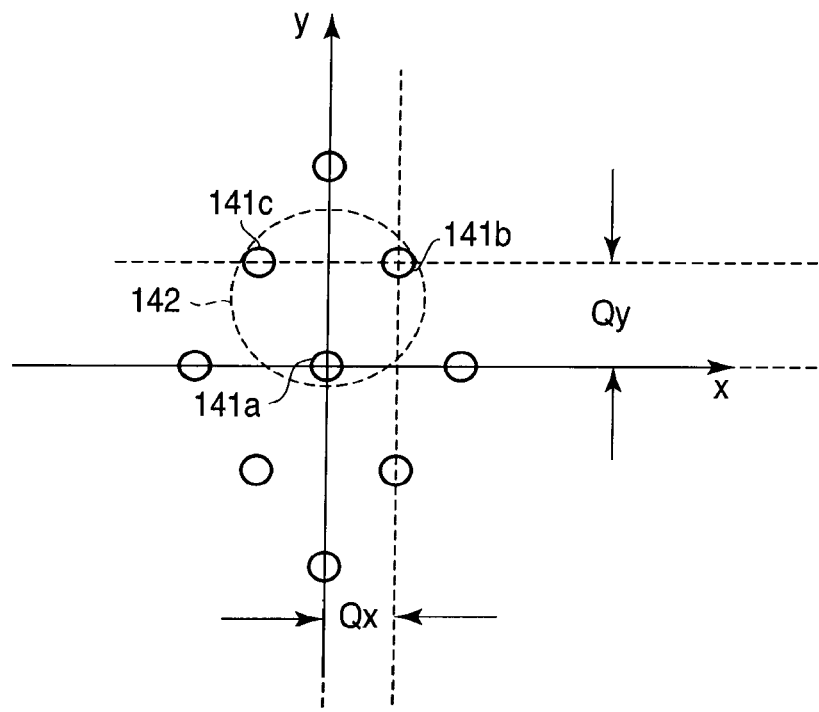
FIG. 11 is a diagram showing the distribution of diffracted light components on the surface corresponding to the surface of the projection lens pupil in the case where the oblique illumination light is radiated, to explain the reason that the dipole illumination is desirable.

Suppose that oblique illumination light from modified illumination (oblique illumination) as shown in FIG. 10 is applied to the mask pattern shown in FIG. 7. The position (a luminous region 132) of the oblique illumination light is properly shifted (shift amount σs) in a y-axis direction, such that three diffracted light components 141a, 141b, 141c can be positioned in the effective region 142 of the projection lens pupil, for example, as shown in FIG. 11. Therefore, the three diffracted light components 141a, 141b, 141c reach the substrate through the projection lens, so that interference is produced and an image can be formed on the substrate.

Figure 12:
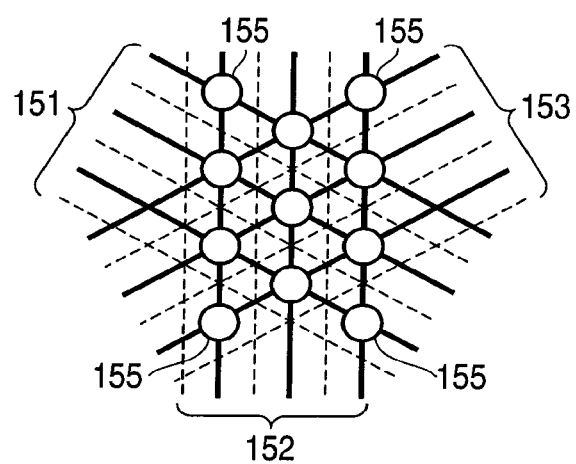
FIG. 12 is a diagram showing as an example the case where an image is formed on a substrate by the interference of three diffracted light components, to explain the reason that the dipole illumination is desirable.

In the example shown in FIG. 12, an image (see FIG. 3) corresponding to the openings 122 in FIG. 7 is formed on the substrate by the interference of the three diffracted light components 141a, 141b, 141c shown in FIG. 11.

As shown in FIG. 12, one-dimensional interference fringes 151 are produced on the substrate due to the interference between the diffracted light 141a and the diffracted light 141b. Likewise, interference fringes 152 are produced on the substrate due to the interference between the diffracted light 141b and the diffracted light 141c, and interference fringes 153 are produced on the substrate due to the interference between the diffracted light 141c and the diffracted light 141a. It should be noted that full lines indicate the peaks of the bright parts of the interference fringes and that broken lines indicate the peaks of the dark parts of the interference fringes. The light intensity is particularly high at parts 155 where the bright parts of the three interference fringes 151, 152, 153 overlap. Therefore, as shown in FIG. 13, when a positive photoresist 90a is used, contact hole patterns 93 are formed at the positions corresponding to the parts 155.

In addition, FIG. 13 shows the example in which the mask pattern shown in FIG. 7 is used. In the case where the photomask as shown in FIG. 1 is used, an image is formed on the substrate with image intensity corresponding to the sizes of the main openings 11, 12 and the assist openings 21, 22, 23, 24, so that contact hole patterns 91, 92 corresponding to the main openings 11, 12 can only be formed in the photoresist 90 (see FIG. 3).

Here, the relation between the position and intensity of the diffracted light in the projection lens pupil is described.

In FIG. 14, the diffracted light 141a is a light traveling straight in the mask, that is, zero-order diffracted light. The diffracted light components 141b, 141c are primary diffracted light components. In a commonly used binary mask or attenuated phase-shift mask, the diffracted light components 141b, 141c have common amplitude and phase. When the mask pattern is formed by the binary mask or the attenuated phase-shift mask, the amplitude (intensity) A of the diffracted light 141a in the projection lens pupil and the amplitudes B, C of the diffracted light components 141b, 141c are represented by Expressions (3), (4):

$$A = \gamma + 2(1-\gamma)\epsilon_x \epsilon_y \qquad (3)$$

$$B = C = 2(1-\gamma)\frac{\sin(\epsilon_x \pi)}{\pi}\frac{\sin(\epsilon_y \pi)}{\pi} \qquad (4)$$

where γ (a negative value corresponds to the phase-shift mask and 0 corresponds to the binary mask) is the complex amplitude transmittance of a mask light-blocking member (light-blocking region).

<Optimization of Illumination Position>

The shift amount σs of the illumination is set to satisfy Expression (5):

$$\sigma_s = \frac{\lambda}{4NA}\left(\frac{1}{P_y} + \frac{P_y}{P_x^2}\right) \qquad (5)$$

In this case, the distances a, b, c of the three diffracted light components 141a, 141b, 141c from the center of the pupil are equal to each other. As a result, there is no defocus dependency of the interference fringes on the substrate to be calculated later. That is, the focal depth is great enough.

Furthermore, the illumination should be axially symmetrical so that an image may not be positioned out of focus. Hence, the dipole illumination shown in FIG. 2 in which the illumination regions are axially symmetrically arranged is desirable.

<Optimization of Interference Wave Amplitude>

The intensity distribution I (x, y) of an interference wave formed on the substrate is represented by Expression (6):

$$I(x,y) = |A\exp(-ik_a \cdot x) + B\exp(-ik_b \cdot x) + C\exp(-ik_c \cdot x)|^2 \qquad (6)$$

where $k_a$, $k_b$, $k_c$ are wavenumber vectors of the diffracted light components 141a, 141b, 141c, and x is a position vector.

Expressions (3), (4) are substituted for Expression (6), and the result is expanded to obtain Expression (7):

$$I(x,y) = (A^2 + 2B^2) + 2AB\cos\left(\frac{\sqrt{3}}{2}xS - \frac{3}{2}yS\right) + \qquad (7)$$
$$2AB\cos\left(\frac{\sqrt{3}}{2}xS + \frac{3}{2}yS\right) + 2B^2\cos(\sqrt{3}\,xS)$$

where $S = \frac{2\pi}{\lambda}\sin\theta$.

where θ is an angle between the traveling direction of each diffracted light and the normal to the surface of the substrate. Moreover, the first term on the right side of Expression (7) is a uniform component. The second term is an interference wave produced by the interference between the diffracted light 141a and the diffracted light 141b. The third term is an interference wave produced by the interference between the diffracted light 141a and the diffracted light 141c. The fourth term is an interference wave produced by the interference between the diffracted light 141b and the diffracted light 141c.

Here, illumination is provided to satisfy the conditions in Expression (5), and thus no component dependent on z appears in Expression (7). This means that the interference fringes are not affected by defocus in the vicinity of the best focus.

The light intensities in a bright part 156 and two kinds of dark parts 157, 158 shown in FIG. 15 are explained in order to consider the contrast of the interference wave. The light intensities in the bright part 156 and the two kinds of dark parts 157, 158 are provided by Expressions (8), (9), (10). It should be noted that there are a plurality of bright parts and dark parts in addition to the parts shown, and these parts have the common intensity owing to the symmetry. The intensity in each part can be found by Expression (7).

$$\text{Intensity of the bright part (156) } I_0 = I(0,0) = A^2 + 4B^2 + 4AB \qquad (8)$$

Intensity of the dark part (157)

$$I_1 = I\left(\frac{\pi}{\sqrt{3}\,S}, \frac{\pi}{3S}\right) = A^2 \qquad (9)$$

Intensity of the dark part (158)

$$I_2 = I\left(0, \frac{2\pi}{3S}\right) = (A - 2B)^2 \qquad (10)$$

In the case in FIG. 15, two kinds of contrasts can be defined. This means, as indicated in Expressions (11), (12), a contrast $C_1$ along bright part 156—dark part 157—bright part 156, and a contrast $C_2$ along bright part 156—dark part 158—bright part 156.

$$C_1 = \frac{I_0 - I_1}{I_0 + I_1} = \frac{2B(A+B)}{A^2 + 2B^2 + 2AB} \quad (11)$$

$$C_2 = \frac{I_0 - I_2}{I_0 + I_2} = \frac{8AB}{2A^2 + 8B^2} \quad (12)$$

Suppose conditions where the contrasts $C_1$, $C_2$ are maximized. First, the value of the contrast $C_1$ along bright part 156—dark part 157—bright part 156 is maximized under the condition where the intensity in the dark part 157 is 0, that is, in the case where "A=0" in accordance with Expression (9). At this point, "$C_1$=1" but "$C_2$=0", so that a desired image cannot be formed. On the other hand, the value of the contrast $C_2$ along bright part 156—dark part 158—bright part 156 is maximized under the condition where the intensity in the dark part 158 is 0, that is, in the case where "A=2B" in accordance with Expression (10). At this point, "$C_1$=0.6" and "$C_2$=1". This means that the intensity of the contrast $C_1$ is not enough.

Thus, if the condition where "$C_1=C_2$" is an optimum condition, this is achieved when the intensity in the dark part 157 is equal to the intensity in the dark part 158. Therefore, this proves to be correspond to the case where "A=B" in accordance with Expressions (9), (10). In this case, "$C_1=C_2$=0.8".

Consequently, it is apparent that a desirable state of image formation is obtained when the amplitudes A, B, C of the three diffracted light components 141a, 141b, 141c used for image formation are equal to each other.

<Optimization of Mask Bias and Light-Blocking Portion Amplitude Transmittance>

The desirable state of image formation is obtained when "A=B", in other words, when Expression (13) is valid, in accordance with Expressions (3), (4), (5).

$$\gamma + 2(1-\gamma)\varepsilon_x\varepsilon_y = 2(1-\gamma)\frac{\sin(\varepsilon_x\pi)}{\pi}\frac{\sin(\varepsilon_y\pi)}{\pi} \quad (13)$$

Expression (14) is the transformation of Expression (13).

$$\gamma = \frac{2\pi^2\varepsilon_x\varepsilon_y - 2\sin(\varepsilon_x\pi)\sin(\varepsilon_y\pi)}{2\pi^2\varepsilon_x\varepsilon_y - 1 - 2\sin(\varepsilon_x\pi)\sin(\varepsilon_y\pi)} \quad (14)$$

That is, the desirable state of image formation is obtained when a mask bias ($\epsilon$) and the complex amplitude transmittance ($\gamma$) of the attenuated phase-shift mask satisfy the predetermined relation represented by Expression (14).

Here, suppose that "$\epsilon x=\epsilon y=\epsilon$" for simplicity, Expression (14) is represented by Expression (15):

$$\gamma = \frac{2\pi^2\varepsilon^2 - 2\sin^2(\varepsilon\pi)}{2\pi^2\varepsilon^2 - 1 - 2\sin^2(\varepsilon\pi)} \quad (15)$$

FIG. 16 shows the relation between the mask bias ($\epsilon$) and the complex amplitude transmittance ($\gamma$) of the attenuated phase-shift mask. Negative "$\gamma$" represents the situation in which the phase of light passing through the halftone region (mask light-blocking member) is displaced 180 degrees with respect to light passing a light transmitting region. All the situations on this curve satisfy the condition in which the diffracted light intensities are equal to each other.

FIG. 17 shows the relation between the mask bias (the dimension $\epsilon$ of the opening on the mask) and diffracted light amplitude A. It is appreciated from this graph that the image is bright when the mask bias is high and when the complex amplitude transmittance of the mask light-blocking member is negatively high. While the brightness of the image has to be set in accordance with, for example, a desired throughput, resist sensitivity and the stability of laser luminance, the brightness of the image can be set by properly selecting a combination of a mask bias and complex amplitude transmittance.

As described above, according to the present embodiment, the photomask having the assist openings 21, 22, 23, 24 as shown in FIG. 1 is used, and the dipole illumination having the luminous regions 51, 52 as shown in FIG. 2 is used. Thus, the highly accurate contact hole patterns 91, 92 having controlled dimensional errors as shown in FIG. 3 can be formed even if the pattern is miniaturized.

Consequently, when the photomask and modified illumination described above are applied to the manufacture of a semiconductor device (exposure of hole patterns), for example, contact holes for bit-line contact to be connected to a diffusion layer of a selected transistor in a NAND cell unit can be highly accurately formed in a NAND flash memory.

In addition, in the case of the first embodiment described above, the amplitudes of the diffracted light components indicated in Expressions (3), (4) are derived on the basis of a model which determines that a mask pattern is formed of an infinitely thin film, that is, on the basis of Kirchhoff approximate model. It has recently come to be known that the Kirchhoff approximate model is not valid due to the thickness of the mask under the condition where the minimum dimensions of a mask pattern are substantially equal to or less than a wavelength. In this case, the intensity of a diffracted light cannot be represented by a simple expression such as Expressions (3), (4) and can be found by numerically solving a Maxwell's equation. That is, a condition where the intensities of three diffracted light components are equal to each other is found by repetitive calculations in such a manner as to change the complex amplitude transmittance of the mask and the dimensions of the contact hole pattern, for example, as shown in FIG. 18.

Figure 18:
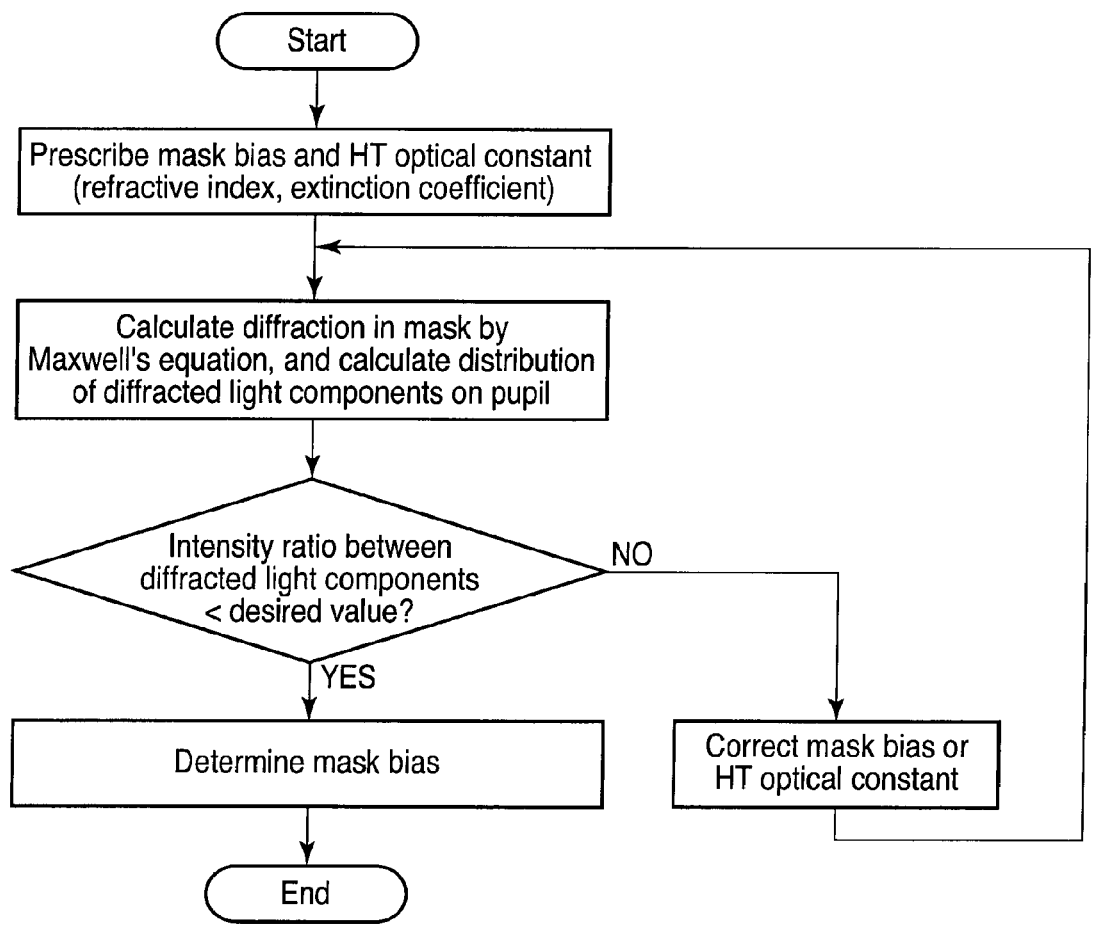
FIG. 18 is a flowchart for finding the intensity of the diffracted light, showing as an example the case where Kirchhoff approximate model is not valid.

In particular, when there is no need for a calculation that takes into account the influence of the thickness of the mask, the calculation shown in FIG. 18 has only to be performed using transmittance instead of the optical constant of a attenuated film.

Furthermore, four assist openings are provided in the example described in the above embodiment. This is not limitation. For example, six or more rows of assist openings may be provided.

Still further, the shape of the main openings and assist openings is not exclusively square and may be, for example, rectangular, circular or elliptic.

Further yet, the shape of the luminous regions of the modified illumination is not exclusively circular and may be, for example, elliptic.

Further yet, the modified illumination is not exclusively the dipole illumination and may be, for example, quadrupole illumination.

FIG. 19 shows an example of the configuration of quadrupole illumination suitably used for the formation of contact holes for bit-line contact in a NAND flash memory (e.g., a double zigzag arrangement of holes in a NAND-CB layer).

As shown in FIG. 19, the quadrupole illumination which is modified illumination has a luminous region (first luminous region) 251, a luminous region (second luminous region) 252, a luminous region (third luminous region) 253 and a luminous region (fourth luminous region) 254. These luminous regions 251, 252, 253, 254 are enclosed by a nonluminous region 261.

The luminous regions 251, 252, 253, 254 are provided at positions (regions) in crossing directions substantially symmetrically in the x- and y-directions with respect to a center 270 of illumination. That is, the luminous regions 251, 252, 253, 254 have the same shape and the same dimensions. For example, the distance (σ) between the center 270 of illumination and a point contained in the luminous region 251 is provided by Expressions (16), (17), (18).

$$\sigma_x = \frac{\lambda}{2NAP_x} \quad (16)$$

$$\sigma_y = \frac{\lambda}{4NA}\left(\frac{1}{P_y} - \frac{P_y}{P_x^2}\right) \quad (17)$$

$$\sigma = \frac{\lambda}{4NA}\left(\frac{1}{P_y} + \frac{P_y}{P_x^2}\right) \quad (18)$$

where NA is the numerical aperture of the projection lens, λ is an exposure wavelength, Px is the pitch of the opening patterns in the word-line direction, and Py is the pitch of the opening patterns in the bit-line direction.

In this connection, the distance (σ) between the center 270 of illumination and the point contained in the luminous region 251 is provided by σx, σy. The distance (σ) between the center 270 of illumination and a point contained in the luminous region 252 is provided by σx, −σy. The distance (σ) between the center 270 of illumination and a point contained in the luminous region 253 is provided by −σx, σy. The distance (σ) between the center 270 of illumination and a point contained in the luminous region 254 is provided by −σx, −σy.

In addition, it is ideally desirable that the center of the luminous region 251 be coincident with the point contained therein, the center of the luminous region 252 be coincident with the point contained therein, the center of the luminous region 253 be coincident with the point contained therein, and the center of the luminous region 254 be coincident with the point contained therein. In this case, the distances (σ) of the luminous regions 251, 252, 253, 254 from the center 270 of illumination are equal to each other.

That is, the shape of the quadrupole illumination having the luminous regions 251, 252, 253, 254 in the directions prescribed by the x- and y-directions is set so that three of the diffracted light components from the photomask pass through the projection lens pupil. In the case of the mask pattern shown in FIG. 7, this quadrupole illumination permits three diffracted light components 241a, 241b, 241c to be located in each of effective regions 242a, 242b, 242c, 242d of the projection lens pupil, for example, as shown in FIG. 20. Thus, the three diffracted light components 241a, 241b, 241c reach the substrate through the projection lens, so that the interference (dark part peaks and bright part peaks in interference fringes) as shown in FIG. 15 is caused, and an image can be formed on the substrate.

FIG. 21 shows an exposure latitude obtained by the quadrupole illumination having the luminous regions 251, 252, 253, 254 in comparison with an exposure latitude obtained by the dipole illumination having the luminous regions 51, 52 (see FIG. 2). In addition, a required margin indicated in the graph is the standard by which an exposure amount and defocus is determined to be unallowable in accordance with the deviation of the dimensions of an actually formed contact hole pattern from desired dimensions of a contact hole pattern formed when a predetermined mask pattern is exposed in a certain exposure amount and with a certain focus.

As apparent from this graph, the dipole illumination (indicated by ■) also makes it possible to obtain an exposure latitude (exposure amount variation margin (EL) and depth of focus (DOF)) substantially equal to that in the case of the quadrupole illumination (indicated by □).

As a result, when the photomask shown in FIG. 1 is used, the contact hole patterns 91, 92 are formed in the photoresist 90, for example, as shown in FIG. 22.

Furthermore, when the quadrupole illumination is employed, it is possible to form in the photoresist 90 randomly arranged independent contact hole patterns 190 in addition to periodic dense hole patterns such as the contact hole patterns 91, 92.

In the case of the quadrupole illumination having the luminous regions 251, 252, 253, 254, symmetry when rotated 90 degrees is more satisfactory than in the case of the dipole illumination having the luminous regions 51, 52. Thus, for example, as shown in FIG. 23A, an opening 222 of the photomask is corrected to be slightly horizontally long, so that the independent contact hole pattern 190 can be formed into a satisfactory circular shape, for example, as shown in FIG. 23B. In addition, 221 denotes a light-blocking region of the photomask.

Thus, in the case where a contact hole for bit-line contact in a NAND flash memory is to be formed, the use of a photomask containing an opening pattern for the formation of an independent contact hole makes it possible not only to form the contact hole for bit-line contact but also to simultaneously form, for example, an independent contact hole for peripheral circuits different in period from the contact hole for bit-line contact.

Furthermore, the illumination is not limited to the dipole illumination and quadrupole illumination described above. It is also possible to use hexapole illumination having the luminous regions (fifth and sixth luminous regions) 51, 52 and the luminous regions (first to fourth luminous regions) 251, 252, 253, 254, for example, as shown in FIG. 24. The luminous regions 51, 52, 251, 252, 253, 254 have the same shape and the same dimensions, and are enclosed by the nonluminous region 261.

The luminous regions 51, 52, 251, 252, 253, 254 are provided at positions symmetrical to each other in the y-direction and at positions (regions) in crossing directions substantially symmetrically in the x- and y-directions with respect to the center of illumination. For example, the distance (σ) between the center of illumination and a point contained in the luminous region 251 is provided by Expressions (19), (20). The distance (σ) between the center of illumination and a point contained in the luminous region 51 is provided by Expression (21).

$$\sigma_x = \frac{\lambda}{2NAP_x} \quad (19)$$

$$\sigma_y = \frac{\lambda}{4NA}\left(\frac{1}{P_y} - \frac{P_y}{P_x^2}\right) \quad (20)$$

$$\sigma = \frac{\lambda}{4NA}\left(\frac{1}{P_y} + \frac{P_y}{P_x^2}\right) \quad (21)$$

where that NA is the numerical aperture of the projection lens, λ is an exposure wavelength, Px is the pitch of the opening patterns in the word-line direction, and Py is the pitch of the opening patterns in the bit-line direction.

In this connection, the distance (σ) between the center of illumination and the point contained in the luminous region 251 is provided by σx, σy. The distance (σ) between the center of illumination and a point contained in the luminous region 252 is provided by σx, −σy. The distance (σ) between the center of illumination and a point contained in the luminous region 253 is provided by −σx, σy. The distance (σ) between the center of illumination and a point contained in the luminous region 254 is provided by −σx, −σy. The distance (σ) between the center of illumination and the point contained in the luminous region 51 is provided by σy. The distance (σ) between the center of illumination and a point contained in the luminous region 52 is provided by −σy.

In addition, it is ideally desirable that the center of the luminous region 51 be coincident with the point contained therein, the center of the luminous region 52 be coincident with the point contained therein, the center of the luminous region 251 be coincident with the point contained therein, the center of the luminous region 252 be coincident with the point contained therein, the center of the luminous region 253 be coincident with the point contained therein, and the center of the luminous region 254 be coincident with the point contained therein. In this case, the distances (σ) of the luminous regions 51, 52, 251, 252, 253, 254 from the center of illumination are equal to each other.

That is, the shape of the hexapole illumination having the luminous regions 51, 52, 251, 252, 253, 254 is set so that three of the diffracted light components from the photomask pass through the projection lens pupil. In the case of the mask pattern shown in FIG. 7, this hexapole illumination permits three diffracted light components 241a, 241b, 241c to be located in each of the effective regions 242a, 242b, 242c, 242d, 242e 242f of the projection lens pupil, for example, as shown in FIG. 25. Thus, the three diffracted light components 241a, 241b, 241c reach the substrate through the projection lens, so that the interference, for example, as shown in FIG. 15 is caused, and an image can be formed on the substrate. That is, similarly to the quadrupole illumination, in the case where a contact hole for bit-line contact in a NAND flash memory is to be formed, the use of a photomask containing an opening pattern for the formation of an independent contact hole makes it possible not only to form the contact hole for bit-line contact but also to simultaneously form, for example, an independent contact hole for peripheral circuits different in period from the contact hole for bit-line contact.

Second Embodiment

Figure 26:
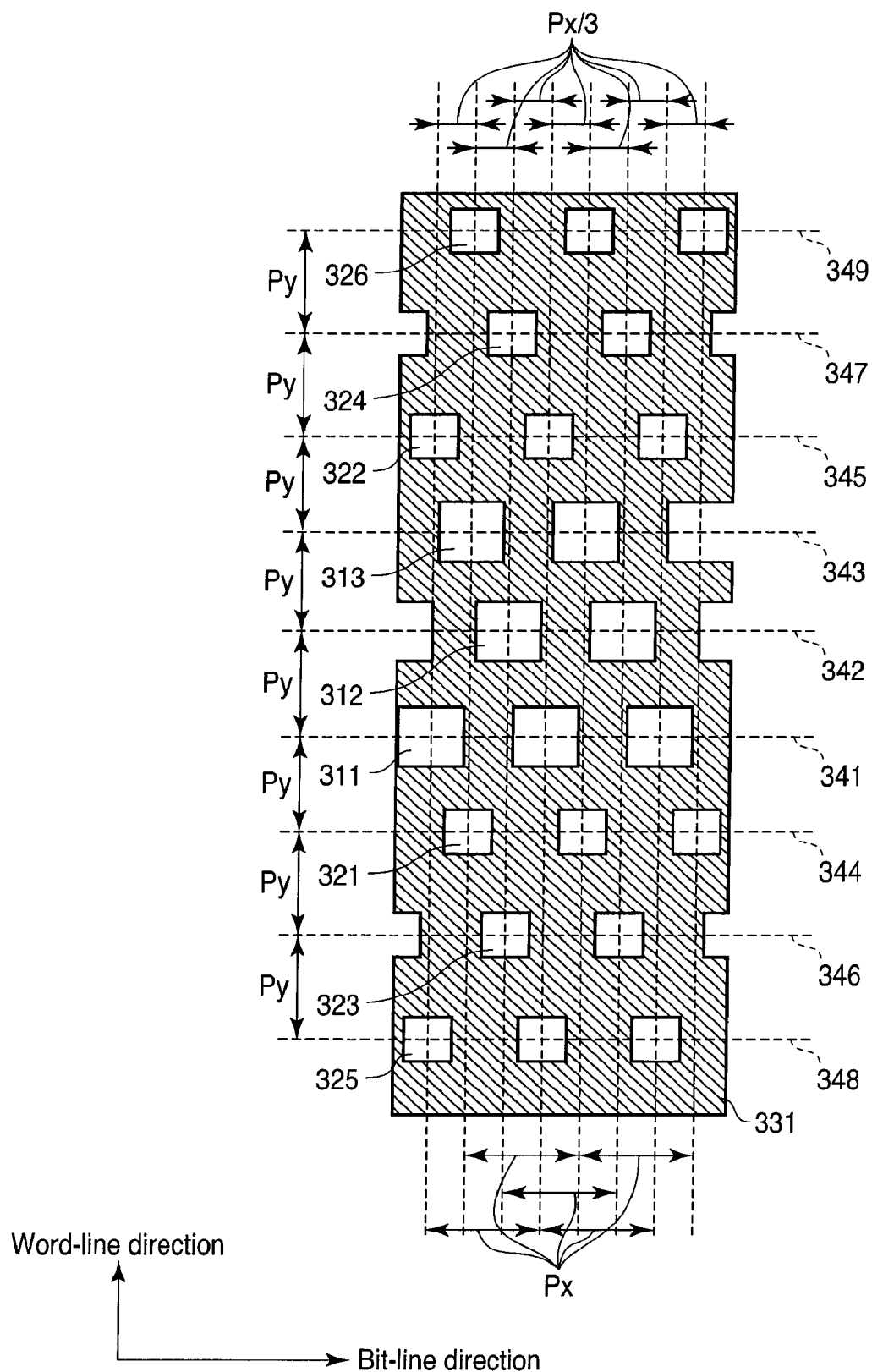
FIG. 26 is a plan view showing one example of a photomask according to a second embodiment of the present invention.

FIG. 26 shows one example of a photomask according to a second embodiment of the present invention. It should be noted that contact holes for bit-line contact in a NAND flash memory (what is called a micropattern which is a dense hole pattern and in which holes are not orthogonally arranged in the form of a lattice; for example, a triple zigzag arrangement of holes in a NAND-CB layer) are formed in the case described as an example in the present embodiment.

That is, in the present embodiment, for example, as shown in FIG. 27, contact holes CB for bit-line contact connected to bit lines BL of a half-pitch (HPnm) width are arranged in three rows (triple zigzag arrangement) in a staggered form in a NAND flash memory. In this case, the contact holes CB are disposed at the same position in the bit lines BL 6 HPnm away from each other. This enables the highly accurate arrangement (formation) of the contact holes CB for bit-line contact in the NAND flash memory having a reduced thickness of the bit line BL and a reduced pitch between the bit lines BL.

In FIG. 26, the photomask has main openings (first main openings) 311, main openings (second main openings) 312, main openings (third main openings) 313, assist openings (first assist openings) 321, assist openings (second assist openings) 322, assist openings (third assist openings) 323, assist openings (fourth assist openings) 324, assist openings (fifth assist openings) 325 and assist openings (sixth assist openings) 326. These openings 311, 312, 313, 321, 322, 323, 324, 325, 326 are enclosed by a light-blocking region (non-transparent region) 331. The light-blocking region 331 is, for example, a light-blocking region in which a chromium film is formed, or, for example, a semitransparent halftone phase-shift region in which a molybdenum silicide film is formed.

The main openings 311, 312, 313 have the same shape and dimensions, and the assist openings 321, 322, 323, 324, 325, 326 have the same shape and dimensions. The assist openings 321, 322, 323, 324, 325, 326 are smaller than the main openings 311, 312, 313.

The main openings 311, 312, 313 are opening patterns (transferred patterns) corresponding to contact hole patterns for bit-line contact. Patterns corresponding to the main openings 311, 312, 313 are formed in a photoresist after exposure and development processes. The assist openings 321, 322, 323, 324, 325, 326 are auxiliary patterns (non-resolution assist patterns). Patterns corresponding to the assist openings 321, 322, 323, 324, 325, 326 are not formed in the photoresist after the exposure and development processes.

The plurality of main openings 311 are arranged at a pitch Px (second interval) on a straight line (first straight line) 341 extending in a bit-line direction (second direction). That is, the center of each of the main openings 311 is located on the straight line 341. The plurality of main openings 312 adjacent to the main openings 311 are arranged at the pitch Px on a straight line (second straight line) 342 extending in the bit-line direction. That is, the center of each of the main openings 312 is located on the straight line 342. The plurality of main openings 313 adjacent to the main openings 312 are arranged at the pitch Px on a straight line (third straight line) 343 extending in the bit-line direction. That is, the center of each of the main openings 313 is located on the straight line 343.

The straight line 341, the straight line 342 and the straight line 343 are parallel to each other, and the distance (first distance (first interval) in a first direction (word-line direction)) between the straight line 341, the straight line 342 and the straight line 343 is Py. Moreover, the main openings 311, the main openings 312 and the main openings 313 are displaced Px/3 (2HPnm) from each other in the bit-line direction.

The plurality of assist openings 321 adjacent to the main openings 311 are arranged at the pitch Px on a straight line (fourth straight line) 344 extending in the bit-line direction. That is, the center of each of the assist openings 321 is located on the straight line 344. The plurality of assist openings 322 adjacent to the main openings 313 are arranged at the pitch Px on a straight line (fifth straight line) 345 extending in the bit-line direction. That is, the center of each of the assist openings 322 is located on the straight line 345. The plurality of assist openings 323 adjacent to the assist openings 321 are arranged at the pitch Px on a straight line (sixth straight line) 346 extending in the bit-line direction. That is, the center of each of the assist openings 323 is located on the straight line 346. The plurality of assist openings 324 adjacent to the assist openings 322 are arranged at the pitch Px on a straight line (seventh straight line) 347 extending in the bit-line direction. That is, the center of each of the assist openings 324 is located on the straight line 347. The plurality of assist openings 325 adjacent to the assist openings 323 are arranged at the pitch Px on a straight line (eighth straight line) 348 extending in the bit-line direction. That is, the center of each of the assist openings 325 is located on the straight line 348. The plurality of assist openings 326 adjacent to the assist openings 324 are arranged at the pitch Px on a straight line (ninth straight line) 349 extending in the bit-line direction. That is, the center of each of the assist openings 326 is located on the straight line 349.

The straight lines 341, 342, 343, 344, 345, 346, 347, 348 and 349 are parallel to each other. The distance (first interval) between the straight line 341 and the straight line 344 is Py, and the distance between the straight line 343 and the straight line 345 is also Py. Further, the distance between the straight line 344 and the straight line 346 is Py, and the distance between the straight line 345 and the straight line 347 is also Py. Moreover, the distance between the straight line 346 and the straight line 348 is Py, and the distance between the straight line 347 and the straight line 349 is also Py.

In addition, the assist openings 322, 325 are arranged at the same pitch (Px) as the main openings 311 in the bit-line direction. The assist openings 323, 324 are also arranged at the same pitch (Px) as the main openings 312. The assist openings 321, 326 are also arranged at the same pitch (Px) as the main openings 313. That is, the assist openings 321, 326, the assist openings 323, 324 and the assist openings 322, 325 are displaced Px/3 from each other in the bit-line direction.

It is appreciated from the above explanation that the assist openings 325, the assist openings 323, the assist openings 321, the main openings 311, the main openings 312, the main openings 313, the assist openings 322, the assist openings 324 and the assist openings 326 are arranged at the same pitch in the oblique direction. That is, the photomask shown in FIG. 26 is increased in the periodicity in the oblique direction by the addition of the assist openings 321, 322, 323, 324, 325, 326.

Here, for example, it is assumed that NA=1.3, λ=193 nm, Px=110 nm and Py=110 nm when the pitch Py of the opening patterns in the word-line direction and the pitch Px in the bit-line direction satisfy the relation in Expression (22):

$$\sqrt{\left(\frac{P_x}{3}\right)^2 + P_y^2} < \frac{\lambda}{NA} \tag{22}$$

where NA is the numerical aperture of a projection lens, and λ is an exposure wavelength.

When a microhole pattern is to be formed under such conditions (the wavelength λ and the numerical aperture NA), the use of conventional general illumination (vertical illumination light) results in insufficient contrast of an image to be formed on a substrate, so that such conditions are vulnerable to errors in exposure or focus. It is therefore impossible to form a necessary hole pattern. There is no problem in the case where the pitches Px, Py of the opening patterns are great when the size of the opening pattern on the photomask is equal to a numerical value obtained by dividing a desired dimension of the hole pattern on the substrate by the magnification of the projection lens. However, the size of the opening pattern matters when the pitches Px, Py are small.

The present embodiment enables the formation of a microhole pattern (a micropattern which is a dense hole pattern and in which holes are not orthogonally arranged in the form of a lattice) suitable for exposure under conditions where the minimum pattern pitch of the opening patterns is λ/NA, in a photolithography technique used for the exposure of the hole patterns.

FIG. 28 shows an example of the configuration of illumination in the present embodiment. In the present embodiment, modified dipole illumination which is modified illumination is used.

As shown in FIG. 28, the modified dipole illumination has a luminous region (first luminous region) 451 and a luminous region (second luminous region) 452. These luminous regions 451, 452 are enclosed by a nonluminous region 461.

The luminous region 451 and the luminous region 452 are provided at symmetrical positions prescribed by the x- and y-directions with respect to a center 470 of illumination. That is, the luminous region 451 and the luminous region 452 have the same shape and the same dimensions. The center of the luminous region 451 and the center of the luminous region 452 are located symmetrically to each other with respect to the center 470 of illumination. In this case, the distance (σ) between the center 470 of illumination and the center of the luminous region 451 is equal to the distance between the center 470 of illumination and the center of the luminous region 452. It is ideally desirable that the center of the luminous region 451 be coincident with a point contained therein and that the center of the luminous region 452 be coincident with a point contained therein.

In addition, the distance a between the center 470 of illumination and the contained points provided by Expressions (23), (24):

$$\sigma_x = \frac{\lambda}{18NA}\left(\frac{9}{P_x} + \frac{2P_x}{P_y^2}\right) \tag{23}$$

$$\sigma_y = -\frac{\lambda}{6P_yNA} \tag{24}$$

where λ is the wavelength of the illumination light, and NA is the numerical aperture of the projection lens through which the illumination light passes.

Oblique illumination light from the above-mentioned modified illumination is applied to the photoresist via the above-mentioned photomask (see FIG. 26), such that a highly accurate contact hole pattern having controlled dimensional errors can be formed on the photoresist.

FIG. 29 shows one example of contact hole patterns formed in a photoresist after the exposure and development processes.

As shown in FIG. 29, contact hole patterns 491, 492, 493 are formed in a photoresist 490. That is, patterns corresponding to the main openings 311, 312, 313 shown in FIG. 26 are formed as the contact hole patterns 491, 492, 493 in the photoresist 490. No patterns corresponding to the assist openings 321, 322, 323, 324, 325, 326 shown in FIG. 26 are not formed in the photoresist 490.

Described below is the reason that the highly accurate contact hole pattern having controlled dimensional errors can be formed by the above-mentioned photomask (see FIG. 26) and by an exposure method using the modified illumination (see FIG. 28).

When the intervals between the patterns sized on the substrate is smaller than λ/NA, the use of vertical illumination light as in small σ illumination does not allow diffracted light components other than zero-order diffracted light to reach the substrate due to a large angle of diffraction. Thus, for example, as shown in FIG. 5, there is no interference and no image is formed. The use of oblique illumination light as in the modified dipole illumination enables image formation owing to the interference between zero-order diffracted light and primary diffracted light, for example, as shown in FIG. 6.

When the oblique illumination light is used, a greater focal depth is obtained by a periodic pattern than by an independent pattern. Thus, in the present embodiment, the assist openings 321, 322, 323, 324, 325, 326 shown in FIG. 26 are added to provide periodicity in the whole pattern. That is, the main openings 311, 312, 313 shown in FIG. 26 are obliquely arranged, so that the periodicity in the oblique direction is increased by the addition of the assist openings 321, 322, 323, 324, 325, 326.

Next, the reason that the modified dipole illumination shown in FIG. 28 is desirable is described. It should be noted that the following explanation is based on the assumption that a mask pattern (photomask) shown in FIG. 30 is used instead of the photomask shown in FIG. 26 for brevity.

Figure 30:
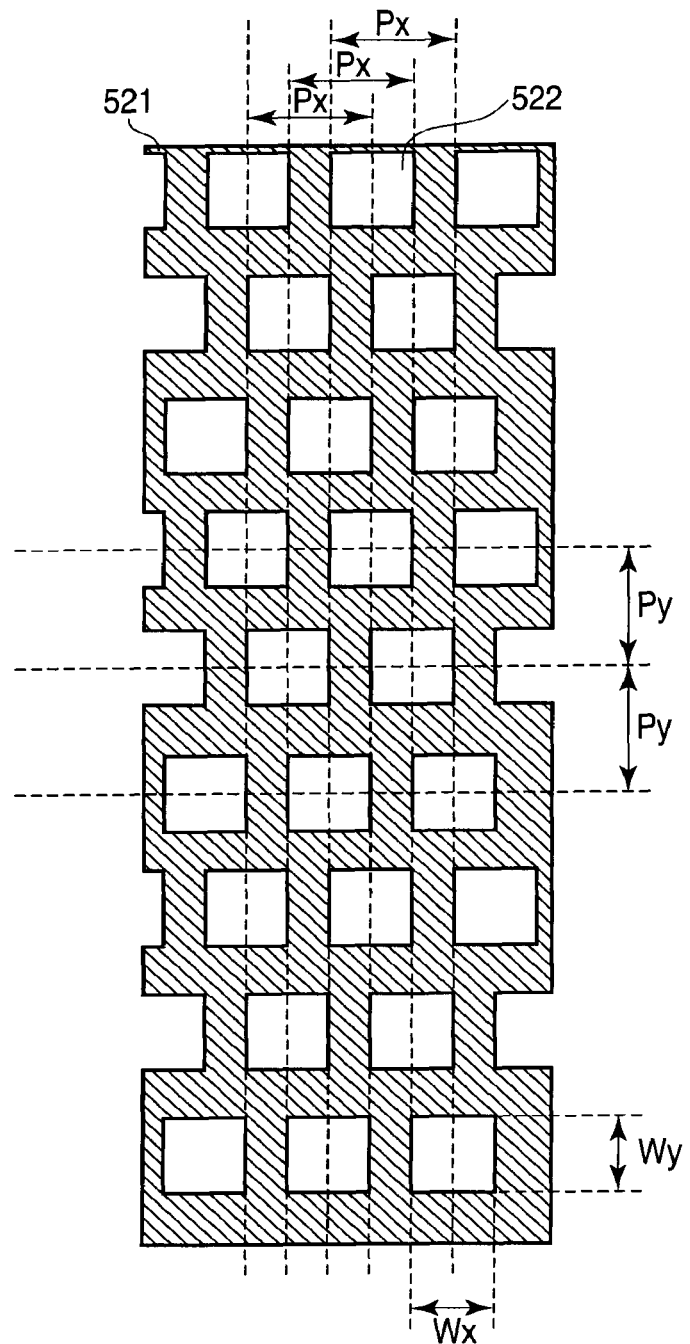
FIG. 30 is a plan view of a mask pattern shown to explain the reason that the modified dipole illumination is desirable.

The photomask shown in FIG. 26 as grating can be considered to produce a diffracted light in the same direction as the mask pattern shown in FIG. 30. In FIG. 30, 521 denotes a light-blocking region, and 522 denotes an opening.

Suppose that the vertical illumination light from illumination (small σ illumination) as shown in FIG. 8 is applied to the mask pattern shown in FIG. 30. That is, in the illumination in FIG. 8, a luminous region 131 is provided in the center of illumination. In this case, a diffracted light in a surface corresponding to that of the pupil of the projection lens shows a distribution in FIG. 31. A coordinate system in FIG. 31 is a coordinate system which is normalized by the numerical aperture NA of the projection lens. That is, FIG. 31 shows the distribution of the diffracted light in the surface of the projection lens pupil in the case where the mask pattern shown in FIG. 30 is Fourier-transformed.

In FIG. 31, 541g denotes zero-order diffracted light, and 541f denotes 1st-order diffracted light. Further, in FIG. 30, the pitch of the openings 522 in the x-direction is Px, and the pitch of the openings 522 in the y-direction is Py. Moreover, 542 in FIG. 31 denotes an effective region (unit circle) of the projection lens pupil, and the diffracted light in the effective region 542 only reaches the substrate. Thus, in the case in FIG. 31, one diffracted light (zero-order diffracted light) 541g alone reaches the substrate, so that there is no interference and no image is formed on the substrate.

Suppose that oblique illumination light from modified illumination (oblique illumination) as shown in FIG. 10 is applied to the mask pattern shown in FIG. 30. The position (a luminous region 132) of the oblique illumination light is properly shifted (shift amounts σx, σy) in a x- and y-axis directions, such that three diffracted light components 541a, 541b, 541c can be positioned in the effective region 542 of the projection lens pupil, for example, as shown in FIG. 32. Therefore, the three diffracted light components 541a, 541b, 541c reach the substrate through the projection lens, so that interference is produced and an image is formed on the substrate.

Figure 33:
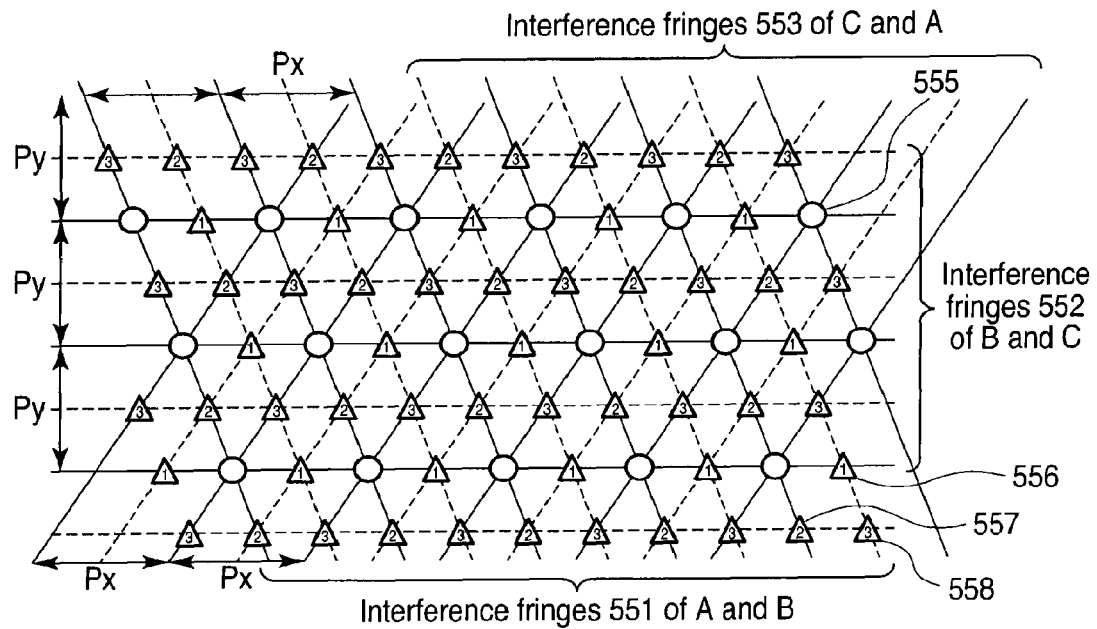
FIG. 33 is a diagram showing as an example the case where an image is formed on a substrate by the interference of three diffracted light components, to explain the reason that the modified dipole illumination is desirable.

In the example shown in FIG. 33, an image corresponding to the openings 522 in FIG. 30 is formed on the substrate by the interference of the three diffracted light components 541a, 541b, 541c shown in FIG. 32.

As shown in FIG. 33, one-dimensional interference fringes 551 are produced on the substrate due to the interference between the diffracted light 541a (A) and the diffracted light 541b (B). Likewise, interference fringes 552 are produced on the substrate due to the interference between the diffracted light 541b (B) and the diffracted light 541c (C), and interference fringes 553 are produced on the substrate due to the interference between the diffracted light 541c (C) and the diffracted light 541a (A). It should be noted that full lines indicate the peaks of the bright parts of the interference fringes and that broken lines indicate the peaks of the dark parts of the interference fringes. The light intensity is particularly high where bright parts 555 of the three interference fringes 551, 552, 553 overlap. Therefore, when a positive photoresist is used, contact hole patterns are formed at the positions corresponding to the parts where the parts 555 overlap.

Thus, in the case where the photomask as shown in FIG. 26 is used, an image is formed on the substrate with image intensity corresponding to the sizes of the main openings 311, 312, 313 and the assist openings 321, 322, 323, 324, 325, 326, so that contact hole patterns 491, 492, 493 corresponding to the main openings 311, 312, 313 can only be formed in the photoresist 490 (see FIG. 29).

Here, the relation between the position and intensity of the diffracted light in the projection lens pupil is described.

In FIG. 32, the diffracted light 541a is a light traveling straight in the mask, that is, zero-order diffracted light. The diffracted light components 541b, 541c, 541f are primary diffracted light components. In a commonly used binary mask or attenuated phase-shift mask, the diffracted light components 541b, 541c, 541f have common amplitude and phase. When the mask pattern is formed by the binary mask or the attenuated phase-shift mask, the amplitude (intensity) A of the diffracted light 541a in the projection lens pupil and the amplitudes B, C, D of the diffracted light components 541b, 541c, 541f are represented by Expressions (25), (26), (27), (28):

$$A = 3\{\gamma + (1-\gamma)\varepsilon_x \varepsilon_y\} \tag{25}$$

$$B = \frac{9(1-\gamma)}{\pi^2}\sin(\pi\varepsilon_x)\sin\left(\frac{\pi\varepsilon_y}{3}\right) \tag{26}$$

$$C = \frac{9(1-\gamma)}{2\pi^2}\sin(\pi\varepsilon_x)\sin\left(\frac{2}{3}\pi\varepsilon_y\right) \tag{27}$$

$$D = \frac{3(1-\gamma)}{\pi}\varepsilon_x \sin(\pi\varepsilon_y) \tag{28}$$

where $\varepsilon_x = w_x/P_x$, $\varepsilon_y = w_y/P_y$, and $P_x$, $P_y$, $w_x$, $w_y$ are the dimensions of the mask shown in FIG. 30.

where γ (a negative value corresponds to the phase-shift mask and 0 corresponds to the binary mask) is the complex amplitude transmittance of a mask light-blocking member (light-blocking region).

<Optimization of Illumination Position>

The shift amount σ of the modified dipole illumination is shifted σx, σy with respect to the center 470 of illumination to satisfy the conditions in Expressions (23), (24).

Figure 34:
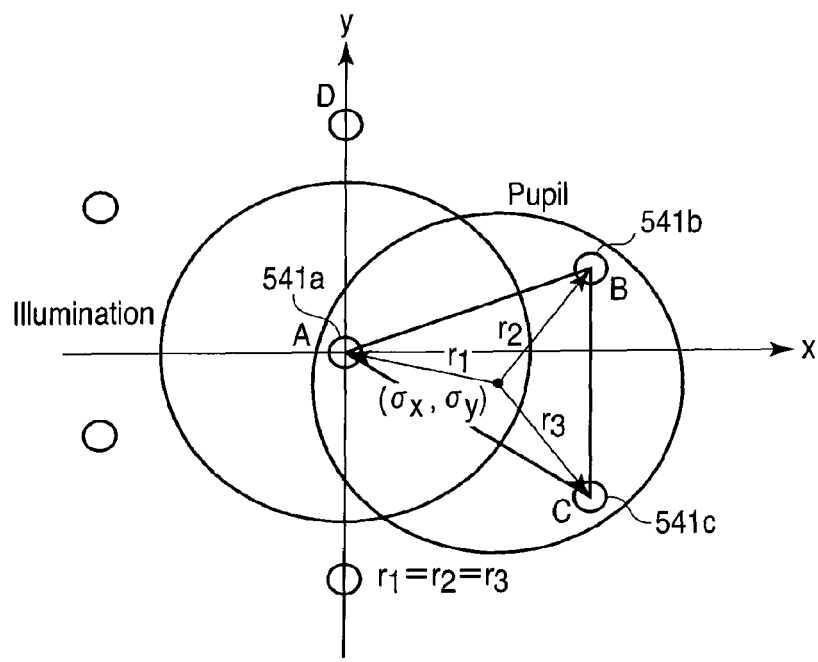
FIG. 34 is a diagram shown to explain the relation between the center of the projection lens pupil and the positions of the diffracted light components, with regard to the reason that the modified dipole illumination is desirable.

In this case, as shown in FIG. 34, the distances r1, r2, r3 of the three diffracted light components 541a, 541b, 541c from the pupil center are equal to each other. As a result, there is no defocus dependency of the interference fringes on the substrate to be calculated later. That is, the focal depth is great enough.

<Optimization of Interference Wave Amplitude>

The intensity distribution I (x, y, z) of an interference wave formed on the substrate by the three diffracted light components 541a, 541b, 541c is represented by Expression (29):

$$I(x,y,z) = |A\exp(-ik_a \cdot x) + B\exp(-ik_b \cdot x) + C\exp(-ik_c \cdot x)|^2 \tag{29}$$

where A, B, C are the amplitudes of the three diffracted light components 541a, 541b, 541c shown in FIG. 32, x is a position vector on the substrate, and ka, kb, kc are wavenumber vectors shown in FIG. 35. The wavenumber vectors ka, kb, kc are represented by Expressions (30), (31), (32):

$$k_a = (S_x, S_y, k_z) \tag{30}$$

$$k_b = \left(S_x - \frac{2\pi}{P_x}, S_y - \frac{2\pi}{3P_y}, k_z\right) \tag{31}$$

$$k_c = \left(S_x - \frac{2\pi}{P_x}, S_y + \frac{4\pi}{3P_y}, k_z\right) \tag{32}$$

where Sx, Sy are amounts indicating the shift amount σ (σx, σy) of the modified dipole illumination. When this value satisfies Expressions (23), (24), the three diffracted light components 541a, 541b, 541c enter the substrate at the same angle. Thus, kz is a common z component of the wavenumber vectors ka, kb, kc.

Expressions (30), (31), (32) are substituted for Expression (29), and the result is expanded to obtain Expression (33):

$$I(x, y, z) = A^2 + B^2 + C^2 + 2AB\cos(k_a \cdot x - k_b \cdot x) + \tag{33}$$
$$2BC\cos(k_b \cdot x - k_c \cdot x) + 2CA\cos(k_c \cdot x - k_a \cdot x)$$
$$= A^2 + B^2 + C^2 + 2AB\cos\left(\frac{2\pi}{P_x}x + \frac{2\pi}{3P_y}y\right) +$$
$$2BC\cos\left(-\frac{2\pi}{P_y}y\right) + 2CA\cos\left(-\frac{2\pi}{P_x}x + \frac{4\pi}{3P_y}y\right)$$

where the first term on the right side of Expression (33) is a uniform component, the second term is an interference wave produced by the interference between the diffracted light 541a and the diffracted light 541b, the third term is an interference wave produced by the interference between the diffracted light 541a and the diffracted light 541c, and the fourth term is an interference wave produced by the interference between the diffracted light 541b and the diffracted light 541c.

Here, illumination is provided to satisfy the conditions in Expression (26), and thus no component dependent on z appears in Expression (33). This means that the interference fringes are not affected by defocus in the vicinity of a best focus. That is, the shift amount σ provided by Expressions (23), (24) enables the illumination region to be located at the optimum position.

The light intensities in the bright part 555 and three kinds of dark parts 556 (dark part 1), 557 (dark part 2), 558 (dark part 3) shown in FIG. 33 are explained in order to consider the contrast of the interference wave. If the coordinates of the bright part 555 are taken as the origin as shown in FIG. 36, the light intensities in the bright part 555 and the three kinds of dark parts 556, 557, 558 are provided by Expressions (34), (35), (36), (37):

Intensity of the bright part (555): $I(0,0) = A^2 + B^2 + C^2 - 2AB + 2BC + 2CA$ (34)

Intensity of the dark part (556):

$$I\left(\frac{P_x}{2}, 0\right) = A^2 + B^2 + C^2 - 2AB + 2BC - 2CA \tag{35}$$

Intensity of the dark part (557):

$$I\left(\frac{P_x}{3}, \frac{P_y}{2}\right) = A^2 + B^2 + C^2 - 2AB - 2BC + 2CA \tag{36}$$

Intensity of the bright part (558):

$$I\left(-\frac{P_x}{6}, \frac{P_y}{2}\right) = A^2 + B^2 + C^2 + 2AB - 2BC - 2CA \tag{37}$$

In the case in FIG. 33, three kinds of contrasts $C_1$, $C_2$, $C_3$ can be defined, as indicated in Expressions (38), (39), (40):

$$C_1 = \frac{2AB + 2CA}{A^2 + B^2 + C^2 + 2BC} \tag{38}$$

$$C_2 = \frac{2AB + 2BC}{A^2 + B^2 + C^2 + 2CA} \tag{39}$$

$$C_3 = \frac{2BC + 2CA}{A^2 + B^2 + C^2 + 2AB} \tag{40}$$

Suppose conditions where the contrasts $C_1$, $C_2$, $C_3$ are maximized. That is, it can be said that the optimum values of the amplitudes A, B, C of the three diffracted light components 541a, 541b, 541c are obtained under conditions where the minimum values of the contrasts $C_1$, $C_2$, $C_3$ are maximized.

Thus, if B=pA and C=qA, then Expressions (38), (39), (40) will be Expressions (41), (42), (43):

$$C_1 = \frac{2p + 2q}{1 + p^2 + q^2 + 2pq} \tag{41}$$

$$C_2 = \frac{2p + 2pq}{1 + p^2 + q^2 + 2q} \tag{42}$$

$$C_3 = \frac{2pq + 2q}{1 + p^2 + q^2 + 2p} \tag{43}$$

FIG. 37 shows the relation between the minimum values of the contrasts $C_1$, $C_2$, $C_3$ and p, q. It is appreciated from this graph that the minimum values of the contrasts $C_1$, $C_2$, $C_3$ are maximized when p=1, q=1. At this point, "A=B=C", so that high contrast ($C_1$=$C_2$=$C_3$=0.8) is obtained.

It is thus apparent that in the case where the diffracted light components are given as in FIG. 34, a desirable state of image formation is obtained when the amplitudes A, B, C of the three diffracted light components 541a, 541b, 541c used for image formation are equal to each other.

<Optimization of Mask Bias and Light-Blocking Portion Amplitude Transmittance>

The desirable state of image formation is obtained when "A=B=C=D". Thus, suppose that "B=C". Expression (44) is obtained in accordance with Expressions (26), (27).

$$\frac{9(1-\gamma)}{\pi^2}\sin(\pi\varepsilon_x)\sin\left(\frac{\pi\varepsilon_y}{3}\right) = \frac{9(1-\gamma)}{2\pi^2}\sin(\pi\varepsilon_x)\sin\left(\frac{2}{3}\pi\varepsilon_y\right) \tag{44}$$

Expression (44) is expanded to obtain Expression (45):

$$\cos(\sigma\varepsilon_y') = 1 \tag{45}$$

However, it is obvious that Expression (45) is Expression (46):

$$\cos(\pi\epsilon_y') \neq 1 \quad (46)$$

That is, "B=C" can be said to be an impossible state. It is therefore impossible to validate "A=B=C=D".

Thus, in order to provide a state closest to "A=B=C=D", the minimization of Δ (delta) provided by Expression (47) is defined as achieving the optimum state.

$$\Delta = \left|\frac{\max(A, B, C, D) - \min(A, B, C, D)}{A + B + C + D}\right| \quad (47)$$

Figure 38:
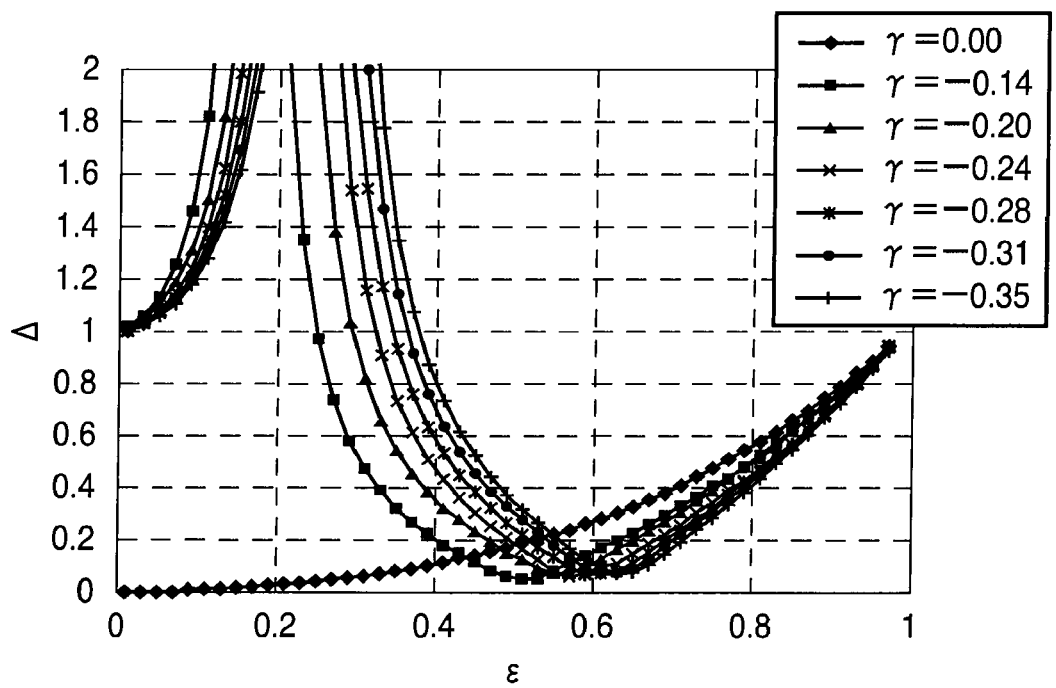
FIG. 38 is a graph shown to explain the relation between $\epsilon$ and $\Delta$.

FIG. 38 shows the relation between ϵ and Δ when a mask bias ϵ=ϵx=ϵy. It is appreciated from this graph that ϵ which minimizes Δ increases as the absolute value of γ (the complex amplitude transmittance of the attenuated phase-shift mask) increases.

Figure 39:
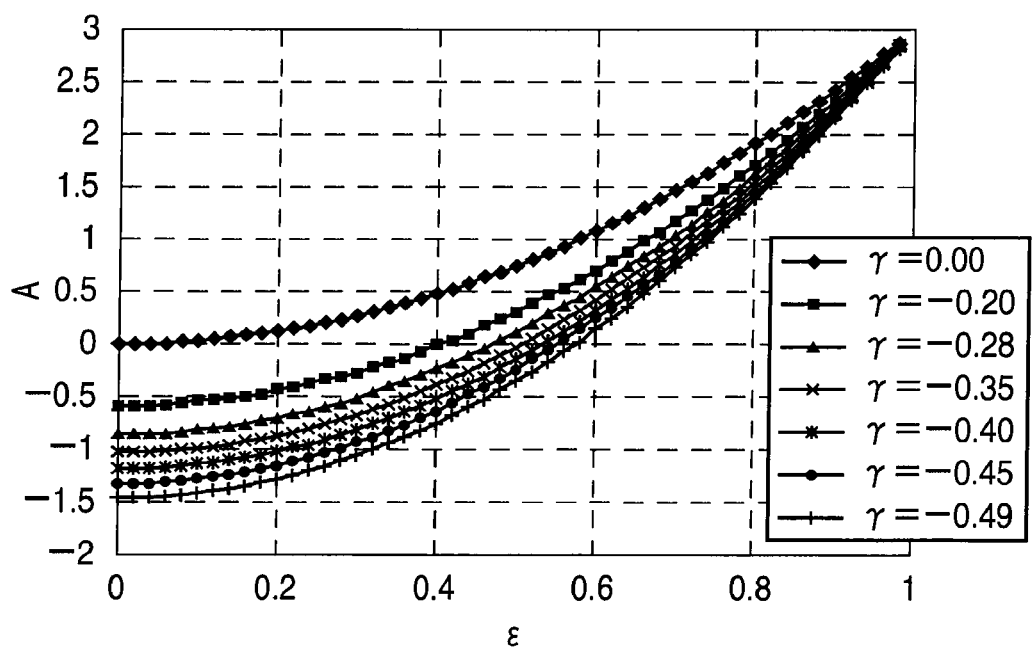
FIG. 39 is a graph shown to explain the relation between $\epsilon$ and diffracted light amplitude A.

FIG. 39 shows the relation between ϵ and the amplitude A of the diffracted light 541a. It is appreciated from this graph that the image is brighter when ϵ is higher. While the brightness of the image has to be set in accordance with, for example, a desired throughput, resist sensitivity and the stability of laser luminance, the brightness of the image can be set by properly selecting a combination of a mask bias and complex amplitude transmittance.

As described above, according to the present embodiment, the photomask having the assist openings 321, 322, 323, 324, 325, 326 as shown in FIG. 26 is used, and the modified dipole illumination having the luminous regions 451, 452 as shown in FIG. 28 is used. Thus, the highly accurate contact hole patterns 491, 492, 493 having controlled dimensional errors as shown in FIG. 29 can be formed even if the pattern is miniaturized (e.g., the minimum pattern pitch is equal to less than λ/NA).

Consequently, when the photomask and modified illumination described above are applied to the manufacture of a semiconductor device (exposure of hole patterns), the contact hole CB for bit-line contact to be connected to the bit line BL can be highly accurately formed in a NAND flash memory, for example, as shown in FIG. 27.

In addition, in the case of the second embodiment described above, the amplitudes of the diffracted light components indicated in Expressions (25), (26), (27), (28) are derived on the basis of the Kirchhoff approximate model which determines that a mask pattern is formed of an infinitely thin film. However, when the Kirchhoff approximate model is not valid, the amplitudes of the diffracted light components can be found by repetitive calculations in such a manner as to change the complex amplitude transmittance of the mask and the dimensions of the contact hole pattern, for example, as shown in FIG. 18.

In particular, when there is no need for a calculation that takes into account the influence of the thickness of the mask, the calculation shown in FIG. 18 has only to be performed using transmittance instead of the optical constant of a attenuated film.

Furthermore, six rows of assist openings are provided in the example described in the above embodiment. This is not limitation. For example, eight or more rows of assist openings may be provided.

Still further, the shape of the main openings and assist openings is not exclusively square and may be, for example, rectangular, circular or elliptic.

Further yet, the shape of the luminous regions of the modified illumination is not circular and may be, for example, elliptic.

Further yet, the modified illumination is not exclusively the modified dipole illumination and can be, for example, modified quadrupole illumination.

FIG. 40 shows an example of the configuration of modified quadrupole illumination suitably used for the formation of contact holes for bit-line contact in a NAND flash memory (e.g., a triple zigzag arrangement of holes in a NAND-CB layer).

As shown in FIG. 40, the modified quadrupole illumination has a luminous region (first luminous region) 651, a luminous region (second luminous region) 652, a luminous region (third luminous region) 653 and a luminous region (fourth luminous region) 654. These luminous regions 651, 652, 653, 654 are enclosed by a nonluminous region 661.

The luminous region 651 and the luminous region 654 as well as the luminous region 652 and the luminous region 653 are provided at symmetrical positions prescribed by the x- and y-directions with respect to a center 670 of illumination. The center of the luminous region 651 and the center of the luminous region 654 are located symmetrically to each other with respect to the center 670 of illumination. The center of the luminous region 652 and the center of the luminous region 653 are located symmetrically to each other with respect to the center 670 of illumination.

In this connection, the distance (σ) between the center 670 of illumination and a point contained in the luminous region 651 is provided by σx, σy. The distance (σ) between the center 670 of illumination and a point contained in the luminous region 652 is provided by σx, −σy. The distance (σ) between the center 670 of illumination and a point contained in the luminous region 653 is provided by −σx, σy. The distance (a) between the center 670 of illumination and a point contained in the luminous region 654 is provided by −σx, −σy.

It is ideally desirable that the center of the luminous region 651 be coincident with the point contained therein, the center of the luminous region 652 be coincident with the point contained therein, the center of the luminous region 653 be coincident with the point contained therein, and the center of the luminous region 654 be coincident with the point contained therein. In this case, the distances (σ) of the luminous regions 651, 652, 653, 654 from the center 670 of illumination are equal to each other.

In addition, the distance (σ) between the center 670 of illumination and the point contained in the luminous region 651 is provided by Expressions (48), (49):

$$\sigma_x = \frac{\lambda}{18NA}\left(\frac{9}{P_x} - \frac{2P_x}{P_y^2}\right) \quad (48)$$

$$\sigma_y = -\frac{\lambda}{2P_y NA} \quad (49)$$

where λ is the wavelength of the illumination light, NA is the numerical aperture of the projection lens through which the illumination light passes, Px is the pitch of the opening patterns in the bit-line direction, and Py is the pitch of the opening patterns in the word-line direction.

In this case, the three diffracted light components 541a, 541b, 541c can have a state as shown in FIG. 41.

Furthermore, in FIG. 40, for example, the distance (σ) between the center 670 of illumination and the point contained in the luminous region 652 is provided by Expressions (50), (51):

$$\sigma_x = \frac{\lambda}{18NA}\left(\frac{9}{P_x} - \frac{2P_x}{P_y^2}\right) \quad (50)$$

$$\sigma_y = -\frac{\lambda}{2P_yNA} \quad (51)$$

In this case, the three diffracted light components 541a, 541b, 541c can have a state as shown in FIG. 42.

As described above, the shape of the modified quadrupole illumination having the luminous regions 651, 652, 653, 654 in the directions prescribed by the x- and y-directions is set so that three 541a, 541b, 541c of the diffracted light components from the photomask pass through the projection lens pupil. Thus, the three diffracted light components 541a, 541b, 541c reach the substrate through the projection lens, so that the interference (dark part peaks and bright part peaks in interference fringes) as shown in FIG. 33 is caused, and an image can be formed on the substrate. As a result, when the photomask in FIG. 26 is used, the contact hole patterns 491, 492, 493 are formed in the photoresist 490, for example, as shown in FIG. 29.

Furthermore, when the modified quadrupole illumination is employed, it is possible to form in the photoresist 490 randomly arranged independent contact hole patterns (not shown) in addition to periodic dense hole patterns such as the contact hole patterns 491, 492, 493.

Further yet, the modified illumination is not limited to the modified dipole illumination and the modified quadrupole illumination described above, and can be, for example, modified hexapole illumination having luminous regions (fifth and sixth luminous regions) 451, 452 and luminous regions (first to fourth luminous regions) 651, 652, 653, 654, for example, as shown in FIG. 43. The luminous regions 451, 452, 651, 652, 653, 654 have the same shape and the same dimensions, and are enclosed by a nonluminous region 661.

For example, the distance (σ) between the center 670 of illumination and points contained in the luminous region 451, 452 is provided by Expressions (23), (24). The distance (σ) between the center 670 of illumination and points contained in the luminous region 651, 654 is provided by Expressions (48), (49). The distance (σ) between the center 670 of illumination and points contained in the luminous region 652, 653 is provided by Expressions (50), (51).

As described above, the shape of the modified hexapole illumination having the luminous regions 451, 452, 651, 652, 653, 654 is set so that three 541a, 541b, 541c of the diffracted light components from the photomask pass through the projection lens pupil. Thus, the three diffracted light components 541a, 541b, 541c reach the substrate through the projection lens, so that the interference as shown in FIG. 33 is caused, and an image can be formed on the substrate. That is, similarly to the modified quadrupole illumination, in the case where a contact hole for bit-line contact in a NAND flash memory is to be formed, the use of a photomask containing an opening pattern for the formation of an independent contact hole makes it possible not only to form the contact hole for bit-line contact but also to simultaneously form, for example, an independent contact hole for peripheral circuits different in period from the contact hole for bit-line contact.

In addition, the formation of the contact hole for bit-line contact in the NAND flash memory has been described by way of example in both the first and second embodiments. This is however not limitation. For example, the present invention is also applicable to the formation of patterns for wiring in various semiconductor devices.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method, comprising:

applying illumination light from an illumination light source to a photomask containing a mask pattern composed of a transparent region and a nontransparent region, and projecting diffracted light components from the photomask on a substrate via a projection optical system to form a photoresist pattern corresponding to the mask pattern on the substrate, wherein the mask pattern includes a plurality of opening patterns which are the transparent regions, the centers of the opening patterns being arranged on each of a plurality of parallel lines at regular second intervals in a second direction, the plurality of parallel lines having regular first intervals in a first direction and extending in the second direction perpendicular to the first direction, the centers of the plurality of opening patterns arranged on the adjacent ones of the plurality of parallel lines are displaced from each other 1/n of the second interval in the second direction, wherein n is an integer greater than two, an illumination shape of the illumination light source is set so that three of the diffracted light components from the photomask pass through a pupil of the projection optical system, the illumination light source is modified dipole illumination having a first luminous region and a second luminous region which are arranged at symmetrical positions displaced from the center of the illumination light source in the first and second directions, respectively, and at least one of the first luminous region and the second luminous region includes a point which is displaced a distance represented by Expression (1) below in the second direction and a distance represented by Expression (2) below in the first direction from the center of the illumination light source $$\sigma_x = \frac{\lambda}{18NA}\left(\frac{9}{P_x} + \frac{2P_x}{P_y^2}\right) \quad (1)$$

$$\sigma_y = -\frac{\lambda}{6P_yNA} \quad (2)$$

where λ is an exposure wavelength, NA is the numerical aperture of a projection lens, Px is the second interval, and Py is the first interval.

2. The semiconductor device manufacturing method according to claim 1, wherein the mask pattern further includes a plurality of opening patterns which are different in dimensions from the above-mentioned plurality of opening patterns and which are not formed as the photoresist patterns.

3. The semiconductor device manufacturing method according to claim 1, wherein the plurality of opening patterns to which illumination light from the modified dipole illumination is applied is designed to form contact holes for bit-line contact in a NAND flash memory, and the number of the plurality of parallel lines is three.

4. The semiconductor device manufacturing method according to claim 1, wherein the dimensions of the plurality of opening patterns and the complex amplitude transmittance of the nontransparent region in the photomask are set so that the difference of amplitude among the three diffracted light components is minimized, and when the complex amplitude transmittance of the nontransparent region is γ, the second interval is Px, the first interval is Py, a dimension of the opening pattern in the first direction is wy, and a dimension of the opening pattern in the second direction is wx, the complex amplitude transmittance γ, the dimension wy, and the dimension wx are set so that Δ represented by Expressions (3) to (7) is minimized:

$$\Delta = \left|\frac{\max(A, B, C, D) - \min(A, B, C, D)}{A+B+C+D}\right| \quad (3)$$

$$A = 3\{\gamma + (1-\gamma)\varepsilon_x\varepsilon_y\} \quad (4)$$

$$B = \frac{9(1-\gamma)}{\pi^2}\sin(\pi\varepsilon_x)\sin\left(\frac{\pi\varepsilon_y}{3}\right) \quad (5)$$

$$C = \frac{9(1-\gamma)}{2\pi^2}\sin(\pi\varepsilon_x)\sin\left(\frac{2}{3}\pi\varepsilon_y\right) \quad (6)$$

$$D = \frac{3(1-\gamma)}{\pi}\varepsilon_x\sin(\pi\varepsilon_y) \quad (7)$$

where A, B, C and D in Expressions (4), (5), (6), and (7) represent amplitudes of diffracted light components when $\varepsilon_x=w_x/P_x$ and $\varepsilon_y=w_y/P_y$.

5. A semiconductor device manufacturing method comprising:

applying illumination light from an illumination light source to a photomask containing a mask pattern composed of a transparent region and a nontransparent region, and protecting diffracted light components from the photomask on a substrate via a protection optical system to form a photoresist pattern corresponding to the mask pattern on the substrate, wherein the mask pattern includes a plurality of opening patterns which are the transparent regions, the centers of the opening patterns being arranged on each of a plurality of parallel lines at regular second intervals in a second direction, the plurality of parallel lines having regular first intervals in a first direction and extending in the second direction perpendicular to the first direction, the centers of the plurality of opening patterns arranged on the adjacent ones of the plurality of parallel lines are displaced from each other 1/n of the second interval in the second direction, wherein n is an integer greater than two, an illumination shape of the illumination light source is set so that three of the diffracted light components from the photomask pass through a pupil of the projection optical system, the illumination light source is modified quadrupole illumination, the modified quadrupole illumination having a first luminous region, as second luminous region, a third luminous region and a fourth luminous region which are arranged at symmetrical positions displaced from the center of the illumination light source in the first and second directions, respectively, and at least one of the first to fourth luminous regions includes a point which is displaced a distance represented by Expression (1) below in the second direction and a distance represented by Expression (2) below in the first direction from the center of the illumination light source, and a point which is displaced a distance represented by Expression (3) below in the second direction and a distance represented by Expression (4) below in the first direction from the center of the illumination light source $$\sigma_x = \frac{\lambda}{18NA}\left(\frac{9}{P_x} - \frac{2P_x}{P_y^2}\right) \quad (1)$$

$$\sigma_y = \frac{\lambda}{2P_yNA} \quad (2)$$

$$\sigma_x = \frac{\lambda}{18NA}\left(\frac{9}{P_x} - \frac{2P_x}{P_y^2}\right) \quad (3)$$

$$\sigma_y = -\frac{\lambda}{2P_yNA} \quad (4)$$

where λ is an exposure wavelength, NA is the numerical aperture of a projection lens, Px is the second interval, and Py is the first interval.

6. The semiconductor device manufacturing method according to claim 5, wherein the plurality of opening patterns to which illumination light from the modified quadrupole illumination is applied is designed to form contact holes for bit-line contact in a NAND flash memory, the number of the plurality of parallel lines is three, and the mask pattern further includes opening patterns designed to form independent contact holes for peripheral circuits different in period from the contact holes for bit-line contact.

7. A semiconductor device manufacturing method comprising:

applying illumination light from an illumination light source to a photomask containing a mask pattern composed of a transparent region and a nontransparent region, and projecting diffracted light components from the photomask on a substrate via a projection optical system to form a photoresist pattern corresponding to the mask pattern on the substrate, wherein the mask pattern includes a plurality of opening patterns which are the transparent regions, the centers of the opening patterns being arranged on each of a plurality of parallel lines at regular second intervals in a second direction, the plurality of parallel lines having regular first intervals in a first direction and extending in the second direction perpendicular to the first direction, the centers of the plurality of opening patterns arranged on the adjacent ones of the plurality of parallel lines are displaced from each other 1/n of the second interval in the second direction, wherein n is an integer greater than two, an illumination shape of the illumination light source is set so that three of the diffracted light components from the photomask pass through a pupil of projection optical system, the illumination light source is modified hexapole illumination, the modified hexapole illumination having a first luminous region, a second luminous region, a third luminous region, a fourth luminous region, a fifth luminous region and a sixth luminous region which are arranged at symmetrical positions displaced from the center of the illumination light source in the first and second directions, respectively, and at least one of the first to sixth luminous regions includes a point which is displaced a distance represented by Expression (1) below in the second direction and a distance represented by Expression (2) below in the first direction from the center of the illumination light source, a point which is displaced a distance represented by Expression (3) below in the second direction and a distance represented by Expression (4) below in the first direction from the center of the illumination light source, and a point which is displaced a distance represented by Expression (5) below in the second direction and a distance represented by Expression (6) below in the first direction from the center of the illumination light source $$\sigma_x = \frac{\lambda}{18NA}\left(\frac{9}{P_x} - \frac{2P_x}{P_y^2}\right) \tag{1}$$

$$\sigma_y = \frac{\lambda}{2P_yNA} \tag{2}$$

$$\sigma_x = \frac{\lambda}{18NA}\left(\frac{9}{P_x} - \frac{2P_x}{P_y^2}\right) \tag{3}$$

$$\sigma_y = -\frac{\lambda}{2P_yNA} \tag{4}$$

$$\sigma_x = \frac{\lambda}{18NA}\left(\frac{9}{P_x} + \frac{2P_x}{P_y^2}\right) \tag{5}$$

$$\sigma_y = -\frac{\lambda}{6P_yNA} \tag{6}$$

where $\lambda$ is an exposure wavelength, NA is the numerical aperture of a projection lens, Px is the second interval, and Py is the first interval.

8. The semiconductor device manufacturing method according to claim 7, wherein the plurality of opening patterns to which illumination light from the modified hexapole illumination is applied is designed to form contact holes for bit-line contact in a NAND flash memory, the number of the plurality of parallel lines is three, and the mask pattern further includes opening patterns designed to form independent contact holes for peripheral circuits different in period from the contact holes for bit-line contact.

* * * * *

UNITED STATES PATENT AND TRADEMARK OFFICE
CERTIFICATE OF CORRECTION

PATENT NO. : 8,679,731 B2
APPLICATION NO. : 13/606834
DATED : March 25, 2014
INVENTOR(S) : Fukuhara et al.

It is certified that error appears in the above-identified patent and that said Letters Patent is hereby corrected as shown below:

In the Claims

Claim 1, Col. 26, Equation (1), "$P^2{}_y$," should read as --$P_y{}^2$--.

Claim 5, Col. 28, Line 1, "as second" should read as --a second--.

Claim 5, Col. 28, Equation (1), "$P^2{}_y$," should read as --$P_y{}^2$--.

Claim 5, Col. 28, Equation (3), "$P^2{}_y$," should read as --$P_y{}^2$--.

Claim 7, Col. 29, Equation (1), "$P^2{}_y$," should read as --$P_y{}^2$--.

Claim 7, Col. 30, Equation (3), "$P^2{}_y$," should read as --$P_y{}^2$--.

Claim 7, Col. 30, Equation (5), "$P^2{}_y$," should read as --$P_y{}^2$--.

Signed and Sealed this
Eighth Day of July, 2014

Michelle K. Lee
*Deputy Director of the United States Patent and Trademark Office*